United States Patent [19]

Raymond et al.

[11] Patent Number: 5,321,701
[45] Date of Patent: Jun. 14, 1994

[54] METHOD AND APPARATUS FOR A MINIMAL MEMORY IN-CIRCUIT DIGITAL TESTER

[75] Inventors: Douglas W. Raymond, Orinda; B. Karen McElfresh, Walnut Creek; Eugene H. Breniman, Antioch, all of Calif.

[73] Assignee: Teradyne, Inc., Walnut Creek, Calif.

[21] Appl. No.: 621,095

[22] Filed: Dec. 6, 1990

[51] Int. Cl.⁵ .................. G06F 11/00; G01R 31/28
[52] U.S. Cl. ........................... 371/27; 371/22.1; 371/22.5
[58] Field of Search ............... 371/27, 22.1, 22.6, 371/25.1, 22.5

[56] References Cited

U.S. PATENT DOCUMENTS

| Re. 31,828 | 2/1985 | Raymond et al. | 324/73 R |
| 3,922,537 | 11/1975 | Jackson | 235/153 |
| 3,976,864 | 8/1976 | Gordon et al. | 235/153 |
| 3,976,940 | 8/1986 | Chau et al. | 324/73 R |
| 4,016,492 | 4/1977 | Miller, Jr. et al. | 324/128 |

(List continued on next page.)

FOREIGN PATENT DOCUMENTS

| 0154048 | 11/1985 | European Pat. Off. |
| 2305217 | 1/1989 | European Pat. Off. |
| 61-66973 | 5/1986 | Japan |
| 61-126481 | 6/1986 | Japan |
| WO89/08297 | 9/1989 | PCT Int'l Appl. |

OTHER PUBLICATIONS

"Programming and Operating Fault Finder's Test System," Jan. 19, 1978.
"FF303 Maintenance Manual," May 5, 1978.
"FF303 Specifications," Feb. 1, 1977.
Schwedner, "A Software System for In-circuit and Functional Testing," Wescow Proceedings, Sep. 1976.
Snook, M. et al., "A new hardware architecture for digital in-circuit testing", IEEE International Test Conference 1983 Proceedings, pp. 64-71.
"HP 3070 Board Test Family," Dec. 1988.
"HP's Advance Testers Meet Your Test Challenges... Today and Tomorrow," Jan. 1989.
"HP Sales Presentation," Jul. 1988.
Frederick J. Hill and Gerald R. Peterson, *Introduction to Switching Theory and Logical Design,* Third Edition (New York: John Wiley & Sons, 1981).
Tom E. Finnell, Membrain/Schlumberger "In-Circuit Testing of LSI-based PCBs," *Electronic Production,* vol. 11 No. 9, Sep. 1982, pp. 47-53.

*Primary Examiner*—Robert W. Beausoliel, Jr.
*Assistant Examiner*—Ly V. Hua
*Attorney, Agent, or Firm*—Arnold, White & Durkee

[57] ABSTRACT

A minimal memory in-circuit digital tester with vector memory concentrated in a centralized vector processor circuit, eliminating the need for pin memory. The vector processor circuit memory is partitioned into two blocks, a pointer memory and a change list memory. Every vector clock cycle has one pointer memory entry. The pointer memory entry is an address for the change list memory. The change list memory contains lists of nodes used in the vector test sequence. Each change list entry contains a pin number and several control bits. The control bits define functions such as whether the pin will toggle its data or enable state, whether there are more pins in that particular change list, and whether the list or test has ended. When the end of each change list is reached, all pins that have been primed by that change list will be toggled. The next entry of the pointer memory is then selected which, in turn, selects another, or perhaps the same change list in the change list memory. Each vector within a test vector file corresponds to one entry in the pointer memory, however, several different pointers can address the same change list. As a result, test vector files of great length can be accommodated using minimal memory.

16 Claims, 12 Drawing Sheets

U.S. PATENT DOCUMENTS

| | | | |
|---|---|---|---|
| 4,092,589 | 6/1978 | Chau et al. | 324/73 R |
| 4,100,532 | 7/1978 | Farnbach | 340/146.3 MA |
| 4,102,491 | 7/1978 | DeVito et al. | 235/302 |
| 4,107,651 | 8/1978 | Martin | 340/146.1 R |
| 4,108,358 | 8/1978 | Niemaszyk et al. | 235/302 |
| 4,175,253 | 11/1979 | Pitegoff | 324/62 |
| 4,176,312 | 11/1979 | Wrinn | 324/57 N |
| 4,176,313 | 11/1979 | Wrinn | 324/62 |
| 4,178,543 | 12/1979 | Wrinn et al. | 324/64 |
| 4,178,544 | 12/1979 | Hoffman | 324/64 |
| 4,216,539 | 8/1980 | Raymond et al. | 371/20 |
| 4,228,537 | 10/1980 | Henckels et al. | 371/23 |
| 4,236,246 | 11/1980 | Skilling | 371/27 |
| 4,253,059 | 2/1981 | Bell et al. | 324/73 R |
| 4,280,220 | 7/1981 | Vaeches | 371/27 |
| 4,338,677 | 7/1982 | Morrill, Jr. et al. | 364/900 |
| 4,433,414 | 2/1984 | Carey | 371/27 |
| 4,449,065 | 6/1984 | Davies, Jr. | 307/473 |
| 4,450,560 | 5/1984 | Conner | 371/25 |
| 4,459,693 | 7/1984 | Prang et al. | 371/20 |
| 4,480,315 | 10/1984 | Hickling | 364/900 |
| 4,493,045 | 1/1985 | Hughes, Jr. | 364/580 |
| 4,493,079 | 1/1985 | Hughes, Jr. | 371/27 |
| 4,500,993 | 2/1985 | Jacobson | 371/16 |
| 4,513,395 | 4/1985 | Henry et al. | 364/900 |
| 4,523,143 | 6/1985 | Dvorak | 324/133 |
| 4,555,783 | 11/1985 | Swanson | 371/15 |
| 4,588,945 | 6/1986 | Groves et al. | 324/158 R |
| 4,594,544 | 6/1986 | Necoechea | 324/73 AT |
| 4,605,894 | 8/1986 | Cox et al. | 324/73 R |
| 4,652,814 | 3/1987 | Groves et al. | 324/73 R |
| 4,806,852 | 2/1989 | Swan et al. | 324/73 R |
| 4,875,210 | 10/1989 | Russo et al. | 371/27 |
| 4,876,685 | 10/1989 | Rich | 371/21.6 |
| 5,027,353 | 6/1991 | Jarwala et al. | 371/27 |
| 5,051,996 | 9/1991 | Bergeson et al. | 371/22.4 |
| 5,127,011 | 6/1992 | Combs et al. | 371/27 |

DPRIME: MS C C C C C C C C C 0 0 0 1 1 0 0 1

FIG. 6F

$\overline{\text{ALLCLEAR}}$: X X X X X X X X X X X 0 0 0 0 0 0 1 1

METHOD AND APPARATUS FOR A MINIMAL MEMORY IN-CIRCUIT DIGITAL TESTER

BACKGROUND OF THE INVENTION

The invention relates to in-circuit digital testers using minimal tester memory.

In-circuit testers are capable of generating and applying digital test signals to electrical nodes of a completed logic circuit, without isolating or removing the components of the circuit from the surrounding components. Known in-circuit testers include those presented in U.S. Pat. Nos. RE 31,828 and 4,500,993, the disclosures of each of which are expressly incorporated herein by reference.

Such in-circuit testers operate by applying electrical signals, defined by a test vector which includes all tester pin states at a particular instant in time, to electrical nodes of a circuit under test. The electrical nodes are contacted by the tester pins. A vector-oriented test exercise is a table or file of such states. In printed form, vectors are typically organized as lines or rows in a file of text. Some preamble information is normally added to this file to relate elements of the vectors to pins in the tester, electrical nodes in the circuit under test, or leads of the component under test. In a file of test vectors, which together constitute a test exercise, each row of the file corresponds to the tester pin states of all participating tester pins during a particular instant in time, and each column represents the states of a single tester pin for each instant in time throughout the entire test exercise.

A file may contain thousands, even hundreds of thousands of vectors, and there may be several hundred tester pins in a tester participating. Thus, the vector file may be extremely large.

A known method of processing these vector files is to equip each tester pin with enough memory and logic to handle the corresponding column in the vector file for the entire test sequence. In operation, each tester pin is associated with a tester channel and the vector file is loaded straight into the channel memories, and then the test is run under control of a vector clock that steps the channel memories from vector to vector within the vector file. With this "RAM behind the pin" approach, memory requirements increase in direct proportion to the number of tester pins (columns) and the number of vectors (rows) in the vector file. In addition, if a channel is not active during application of a particular test vector, the channel memory is not used at all and is wasted.

One approach which has been proposed to conserve channel memory is to update the tester pin states only when the new pin state is different from the old pin state. This approach is disclosed in the above-referenced U.S. Pat No. 4,500,993 wherein the logic states of the individual tester pins are updated (toggled) under control of the vector clock only when the next logic state is different from the present logic state. Otherwise, the pin state remains unchanged. However, even though this approach reduces the amount of channel memory required for a tester (or, alternatively, allows a tester to run larger test vector files), some memory redundancy remains because the pin toggles required to change from one vector to the next within the test vector file may occur identically many times throughout the test sequence.

While this duplication is not without some advantage, in some test applications, for example, the testing of gate arrays, programmable logic devices, LSI peripheral circuits, and the like such redundancy represents inefficient use of memory.

SUMMARY OF THE INVENTION

The present invention addresses the above-noted and other drawbacks of the prior art by centralizing all memory in a test vector processing circuit and by eliminating channel memory. Test sequences of great length can thus be created since test sequence lengths are not constrained by the length of channel memory. Next, the memory stores tester pin transitions only, rather than actual pin states, which further reduces the amount of memory to store a test vector file. Also, memory is reused by storing only unique lists of pin changes that occur each vector clock cycle, and by using redundant change lists during different clock cycles.

Individual ones of the change lists in the change list memory are accessed using address pointers stored in a pointer memory. Each vector clock cycle selects one pointer memory entry which includes an address (pointer) for the change list memory. The change list memory contains lists of tester pins used in the vector tests. Each change list entry contains a pin number, vector sequencer control bits and channel control bits.

In general, the present invention stores a number of change lists, with each entry in each change list including change data for a single entry in a test vector file, with at least one of the stored change lists having more than one entry. Then, test vectors are created for application to electrical nodes of a circuit under test by sequentially selecting individual ones of the change lists in a predetermined order.

During operation, at the beginning of each vector clock cycle, a vector sequencer fetches the contents of an entry in the pointer memory and also stores responses from the previous vector clock cycle for later analysis. The selected pointer memory entry contains the address within the change list memory of the first entry in a list of pins that are to be toggled during that particular vector clock cycle, i.e., the first entry in a change list. The sequencer increments and saves the pointer memory address, loads the pointer memory contents into a change list address register and retrieves the first entry of the selected change list. The sequencer then routes the information contained in the first entry of the selected change list to the channels and activates the indicated channel according to the channel control bits in the change list entry. The sequencer also examines sequencer control bits within the selected change list entry, and if the sequencer control bits indicate the sequencer should continue, the sequencer increments the change list address, fetches the next change list entry, and repeats the prime operation. This increment and prime cycle continues until the sequencer control bits within the selected change list entry indicate the end of that particular change list has been reached or that the sequencer should clock and continue. When the end of a list is reached or when a list element indicates clock and continue, the change list sequencer sends the vector clock to the channels. On the vector clock, all primed channels change state, and all primes are cleared. After sending the vector clock for a clock and continue operation, the sequencer continues to fetch entries from the same change list.

After issuing the vector clock for the end of list, the saved incremented pointer memory address is then retrieved and used to select the next pointer from the pointer memory which results in selection of the first entry in another, or perhaps the same, change list within the change list memory. A new prime cycle then begins. The pointer fetch and prime cycles continue until the sequencer control bits in the selected change list entry indicate an end of test.

Further data compression may be realized through sharing of change lists by including pointers within the pointer memory which point to addresses within the change list memory between the beginning and end of a stored change list. Then, that change list can be used in its entirety by selecting its beginning address, or only a part of the change list can be used by selecting an address between its beginning and ending addresses.

In addition, after processing a test vector file to produce pointer and change list memory contents, yet further compression can be achieved by reordering the entries in the change lists to maximize the occurrence of change list sharing.

Before loading the test vector processing circuit with compressed and optimized vector data in the form of pointer and change list entries, the pointer and change list can be stored on magnetic media such as a disk. Disk storage space can be minimized by reordering the change lists so that more frequently used change lists appear at the beginning of the change list file. Then, the majority of pointers to the reordered change lists can be created without use of a pointer extension word, thus minimizing the overall size of the pointer file.

BRIEF DESCRIPTION OF THE DRAWINGS

FIGS. 6A-6D are the data structure of the driver/receiver control bus during different modes of operation.

FIGS. 6E and 6F are examples of commands appearing on the driver/receiver control bus.

DETAILED DESCRIPTION

In the following disclosure, a bus having multiple signal lines is indicated by a line with a slash through it, and a single line is indicated by a line without a slash. Further, signals are indicated in all capitals, and complemented signals include a bar symbol, for example, VECTORCLOCK and its complement $\overline{\text{VECTOR CLOCK}}$.

Figure 1:
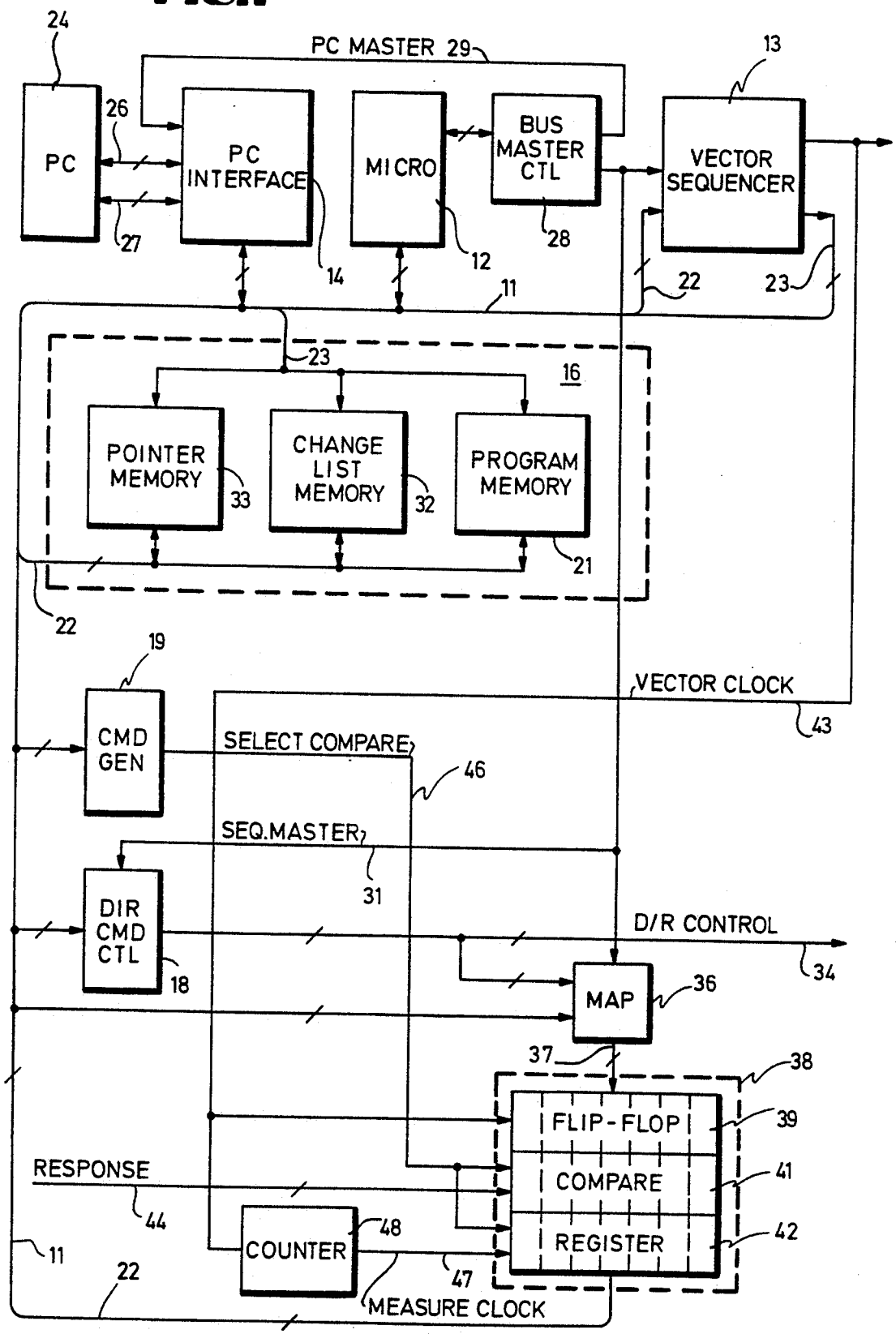
FIG. 1 is a block diagram of a vector processing circuit embodying the present invention.

Referring to FIG. 1, a test vector processor according to the present invention is disclosed. Connected to internal communication bus 11 are microprocessor 12, vector sequencer 13, computer interface 14, static random access memory (RAM) 16, map memory 36, driver/receiver command control 18, and command generator 19. Microprocessor 12 is preferably a Motorola 68000 running with a clock frequency of 10 MHz. The operating program for microprocessor 12 is located in program memory 21 which is a portion of static RAM 16. Internal bus 11 includes bi-directional data bus 22 and address and control bus 23, and is connected through computer interface 14 to an appropriately programmed personal computer (PC) 24, for example, a Deskpro 386 computer, available from Compaq. Like internal bus 11, computer interface 14 includes a bi-directional data bus 26 and an address and control bus 27. The details of the operation of PC 24 are described below with reference to FIGS. 7-12.

At power up, microprocessor 12 is held reset while its operating program is loaded from PC 24 through computer interface 14 and internal bus 11, into program memory 21. Once the operating program is loaded, PC 24 releases control of internal bus 11, and microprocessor 12 begins execution of the operating program, the features and functions of which are described in more detail below. One function of microprocessor 12 is to arbitrate control of internal bus 11 between microprocessor 12, vector sequencer 13, and PC 24. Microprocessor 12 grants bus control through bus master control 28. The signal PCMASTER 29 generated by bus master control 28 indicates that PC 24 has control of bus The signal SEQMASTER 31, generated by bus master control 28, indicates that vector sequencer 13 has control of bus 11. When neither PCMASTER 29 nor SEQMASTER 31 is active, microprocessor 12 has control of bus 11.

Vector sequencer 13 is preferably constructed from 2911-type sequencers available from Advanced Micro Devices, which are 4-bit bit-slice sequencers including internal storage, auto-increment, internal stack memory, and an internal data register.

Static RAM 16 is preferably one megabyte, built from 64K × 4-bit devices, although other sizes and constructions could also be used. Static RAM 16 is dynamically partitioned into program memory 21, change list memory 32 and pointer memory 33, the functions and interactions of which are described in more detail below.

Figure 2:
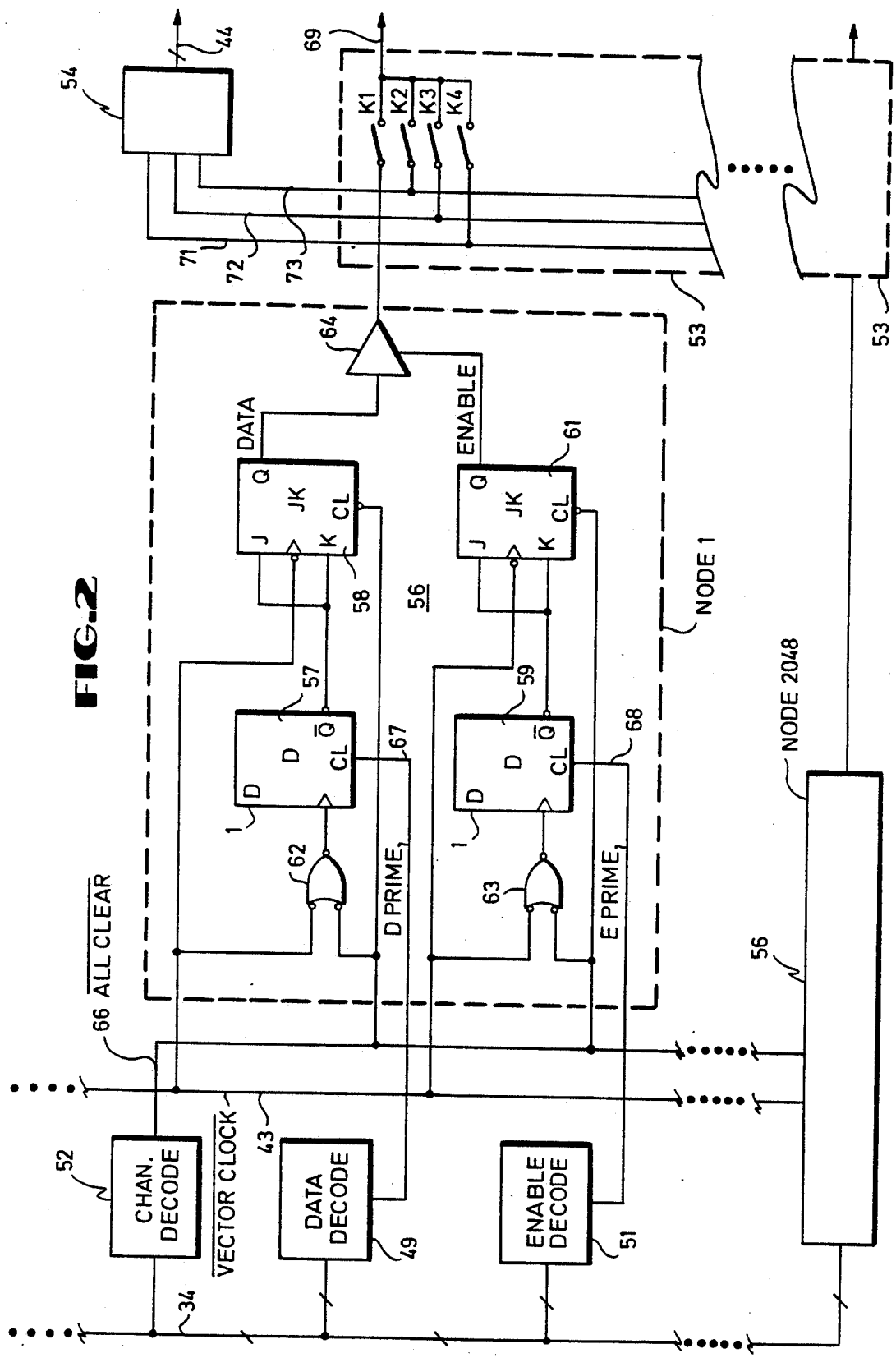
FIG. 2 is a block diagram of the driver/receiver circuit used with FIG. 1.

Internal bus 11 is routed through driver/receiver command control 18 to driver/receiver control bus 34 which, in turn, is connected via a back plane to individual driver/receiver circuits (FIG. 2). All driver/receiver instructions appear on driver/receiver control bus 34, with the structure shown in FIG. 6, described in more detail below. The mapping by driver/receiver command control 18 of internal bus 11 onto driver/receiver control bus 34 differs depending upon the active bus master. The specific mappings are also shown in FIG. 6.

Both internal bus 11 and driver/receiver control bus 34 are connected to response map memory 36. Map memory 36 responds to driver/receiver control bus 34 when vector sequencer 13 is bus master, and responds to internal bus 11 at other times. Internal bus 11 is used to load data into map memory 36. When vector sequencer 13 is bus master, the data in map memory 36 converts data on driver/receiver control bus 34 into expected response controls which appear on bus 37 for application to response analysis circuit 38, described in greater detail with respect to FIG. 4.

Response analysis circuit 38 has six separate and identical channels, each channel including three sections: flip-flop section 39, compare section 41 and register section 42. In flip-flop section 39 of response analysis circuit 38, expected responses are primed under control of map memory 36, and toggled under control of the $\overline{\text{VECTORCLOCK}}$ signal generated by vector sequencer 13 On line 43. Responses are collected from selected driver/receivers on response bus 44. These actual responses are applied to comparator section 41 of response analysis circuit 38, along with the expected data from flip-flop section 39. Under control of the SELECTCOMPARE signal on line 46, the results of the comparison, or the actual response data, are latched in register section 42 by the MEASURECLOCK signal appearing on line 47 which is delayed from the $\overline{\text{VECTORCLOCK}}$ signal by counter 48. The actual response or comparison data stored in register section 42 appears on bus 22 of internal bus 11 and can be stored in the high-order bits of the pointers stored in pointer memory 33. These high-order bits can be accessed by microprocessor 12 through internal bus 11, or by PC 24 through computer interface 14 and internal bus 11 for further analysis.

Referring now to FIG. 2, the driver/receiver channels used in the present invention are disclosed. Each driver/receiver channel includes decoding circuits 49, 51 and 52, reed relay matrix 53, response decoder 54 and driver circuit 56. Each driver circuit 56 is identical, and includes two pairs of prime/toggle flip-flops, one pair (57, 58) being devoted to the data function of the driver, and the other pair (59, 61) being devoted to the enable function of the driver. Also included in the driver circuit are two NOR gates 62 and 63, and three-state pin driver 64.

In the preferred embodiment, 2048 driver/receiver channels and 2048 tester pins are used. In other words, each test vector in the vector file can be up to 2048 bits wide. Although this is the preferred maximum width for the test vector, it will be understood that addition or elimination of driver/receiver channels would be a simple matter, and that test vectors of any width can be used. In addition, it will be understood that the number of driver/receiver channels may or may not be equal to the number of pins. For example, a single driver/receiver channel can be multiplexed to control a number of pins.

In each driver circuit 56, the first flip-flop, 57, 59 of each pair is an D-type flip-flop which the test vector processor of FIG. 1 can address and reset individually. Flip-flops 57 and 59 are referred to as prime flip-flops, and the act of clearing a prime flip-flop is termed herein a priming operation. The second flip-flop 58, 61, of each pair is a JK-type flip-flop configured to operate as a toggle flip-flop when the corresponding prime flip-flop is cleared, and to hold the current state when the corresponding prime flip-flop is set. Flip-flops 58 and 61 are referred to as toggle flip-flops.

One function of the operating program of microprocessor 12 of FIG. 1 is to generate the $\overline{\text{ALLCLEAR}}$ signal on line 66 through driver/receiver control bus 34 and channel decode circuit 52. In the data portion of driver circuit 56, the complemented inputs of NOR gate 62 are connected to the $\overline{\text{ALLCLEAR}}$ signal on line 66, and to the $\overline{\text{VECTORCLOCK}}$ signal on line 43. The output of NOR gate 62 is connected to the clock input of prime flip-flop 57. The data input of prime flip-flop 57 is connected to a logic one. The signal DPRIME on line 67 is decoded from driver/receiver control bus 34 by data decode circuit 49, and drives the clear input of prime flip-flop 57. The $\overline{Q}$ output of prime flip-flop 57 is connected to both J and K inputs of toggle flip-flop 58. The complemented clear input of toggle flip-flop 58 is connected to line 66 to receive the $\overline{\text{ALLCLEAR}}$ signal. The complemented clock input of toggle flip-flop 58 is connected to line 43 to receive the $\overline{\text{VECTORCLOCK}}$ signal. The Q output of toggle flip-flop 58 is applied to the data input of three-state driver 64.

Similarly, in the enable portion of driver circuit 56, the complemented inputs of NOR gate 63 are connected to the $\overline{\text{ALLCLEAR}}$ signal on line 66 and the $\overline{\text{VECTORCLOCK}}$ signal on line 43. The output of NOR gate 63 is connected to the clock input of prime flip-flop 59. The data input of prime flip-flop 59 is tied to a logic one. The signal EPRIME on line 68 is decoded from driver/receiver control bus 34 by enable decode circuit 51, and drives the clear input of prime flip-flop 59. The $\overline{Q}$ output of prime flip-flop 59 is connected to both J and K of toggle flip-flop 61. The complemented clock input of toggle flip-flop 61 is connected to line 43 to receive the $\overline{\text{VECTORCLOCK}}$ signal. The complemented clear input of toggle flip-flop 61 is connected to line 66 to receive the $\overline{\text{ALLCLEAR}}$ signal. The Q output of toggle flip-flop 61 is applied to the enable input of three-state driver 64.

Data decode circuit 49, connected to driver/receiver control bus 34, operates to decode pin addresses and instructions appearing on bus 34. If the pin address matches the address appearing on bus 34, and the instruction is a prime instruction with the DATA bit set, data decode circuit 49 activates the DPRIME signal to clear flip-flop 57, thereby priming flip-flop 57.

Similarly, enable decode circuit 51, connected to driver/receiver control bus 34, operates to decode pin address and instruction data appearing on bus 34. If the pin address matches the address appearing on bus 34, and the instruction is a prime instruction with the ENABLE bit set, enable decode circuit 51 activates the EPRIME signal to clear flip-flop 59, thereby priming flip-flop 59.

After completion of the priming operation for all pins that are to be toggled to generate a particular test vector, vector sequencer 13 (FIG. 1) issues the $\overline{\text{VECTOR CLOCK}}$ signal, and every toggle flip-flop whose respective prime flip-flop has been cleared (primed) changes state. Conversely, every toggle flip-flop whose respective prime flip-flop has not been cleared (not primed) does not change state. Generation of the $\overline{\text{VECTORCLOCK}}$ signal also clocks all prime flip-flops, thereby deactivating them.

The output of three-state node driver 64 is applied to reed relay matrix 53 for selective connection to test pin 69. Test pin 69 is connected, through a spring-loaded probe or the like, to an electrical node of a device under test (not shown). Reed relay matrix 53 is controlled from driver/receiver control bus 34 in a known manner. By selectively opening and closing reed switches K1-K4, test pin 69 can be connected to the output of three-state driver 64, or to any of the three response lines 71, 72 or 73. Thus, by controlling reed relay matrix 53, pin 69 can be used as a stimulus pin, a response pin, or both. Response lines 71, 72 and 73 are applied to response decoder 54 for application to response bus 44. In the preferred embodiment, up to six pins can be used for measurement during each vector cycle. If more than six responses are required for a particular test vector, multiple passes are used. In those instances where multiple passes are used, the pass/fail latch is examined, response relays are set and cleared, and map memory 36 is reprogrammed for each set of response pins. (Also see FIG. 4.) In some instances, the responses stored in the high order bits of pointer memory 33 are also examined between passes. (Other than for examination, pointer memory 33 and change list memory 32 are unchanged for each pass.)

Figure 3:
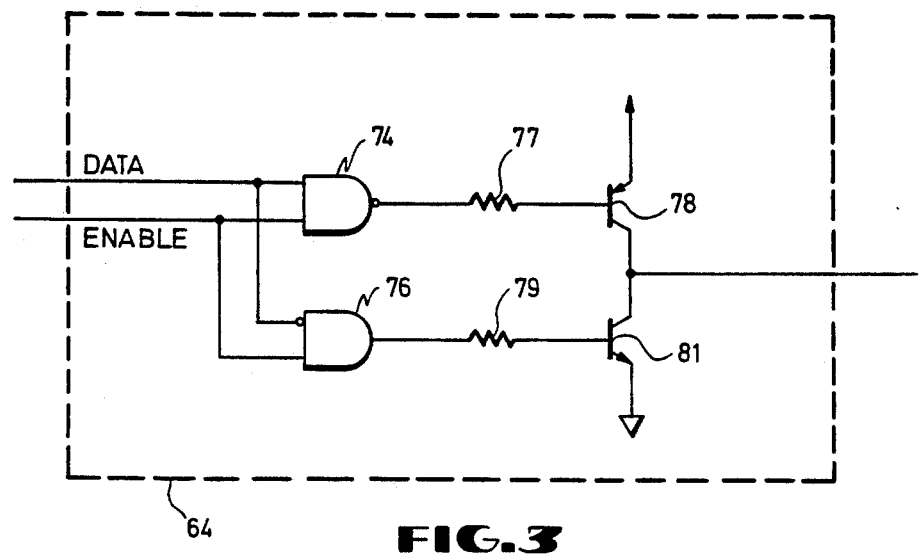
FIG. 3 is a schematic diagram of a three-state node driver used in FIG. 2.

Referring to FIG. 3, the details of three-state node driver 64 are presented. As noted above with respect to FIG. 2, the inputs to three-state node driver 64 are the Q output of data toggle flip-flop 58, and the Q output of enable toggle flip-flop 61. The output of data toggle flip-flop 58 is applied to one input of NAND gate 74, and to the inverting input of AND gate 76. The output of enable toggle flip-flop 61 is applied as an input to NAND gate 74 and as an input to AND gate 76. The output of NAND gate 74 is applied through resistor 77 to the base of PNP transistor 78, and the output of AND gate 76 is applied, through resistor 79, to the base of NPN transistor 81. The emitter of transistor 78 is connected to an appropriate voltage source, for example 5 Volts, and the emitter of transistor 81 is grounded. The collectors of transistors 78 and 81 are common and provide the output of three-state node driver 64.

Figure 4:
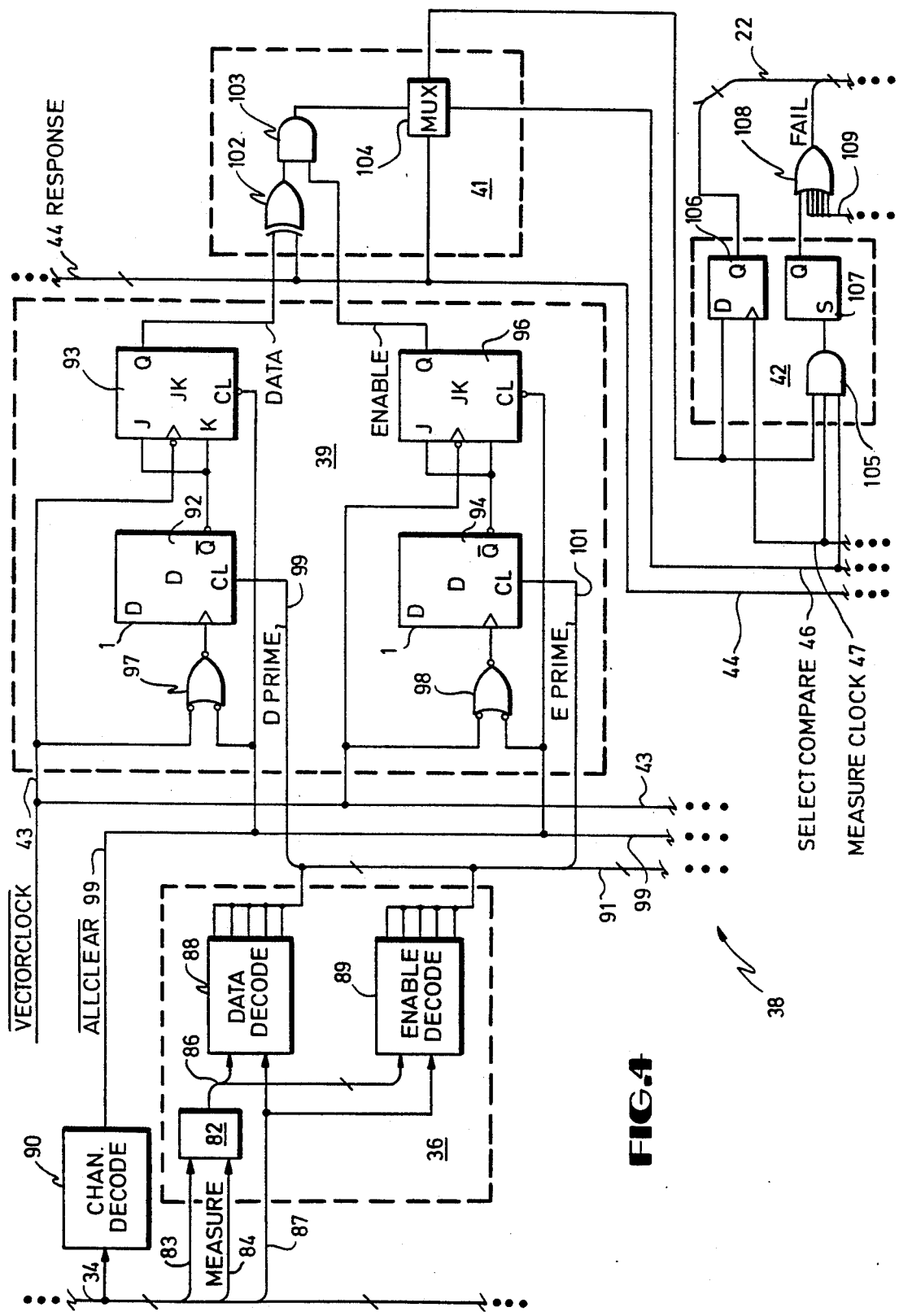
FIG. 4 is a block diagram of a portion of the response analysis circuit of FIG. 1.

One channel of response analysis circuit 38 of FIG. 1 is shown in detail in FIG. 4, and is configured somewhat similar to the individual driver/receiver channels shown in FIG. 2. Each of the six responses appearing on response bus 44 is tested by one of six identical channels of response analysis circuit 38. Map memory 36 is loaded by PC 24 through bus 11 prior to a vector burst. During the vector burst, map memory 36 controls all channels of response analysis circuit 38, and includes storage portion 82 which is addressed by pin address bits 83 of driver/receiver control bus 34, and which is enabled by MEASURE bit 84 of driver/receiver control bus 34. When enabled by MEASURE bit 84, storage portion 82 of map memory 36 translates pin address 83 onto response select bus 86. The bit pattern of response select bus 86 selects one of the six channels in response analysis circuit 38. Any pin address not in the present response map produces a no-channel select code. Response select bus 86 and instruction portion 87 of driver/receiver control bus 34 drive the inputs of decoding logic circuits 88 and 89.

If response select bus 86 indicates an active response channel, and instruction portion 87 indicates a prime instruction with the DATA bit set, data decode circuit 88 activates the DPRIME signal in bus 91 for the appropriate response channel. If response select bus 86 decodes an active response channel, and instruction portion 87 indicates a prime instruction with the ENABLE bit set, enable decode circuit 89 activates the EPRIME in bus 91 for the appropriate response channel.

Each of the six response channels is identically constructed and includes an expected response section 39, a response compare section 41, and a register section 42.

Expected response section 39 is constructed identical to driver circuit 56 of FIG. 2. Each expected response section 39 includes two pairs of flip-flops, one pair (92, 93) being dedicated to the data function of the response, and the other pair (94, 96) being dedicated to the enable function of the response. Each expected response circuit also includes NOR gates 97 and 98. Prime flip-flops 92 and 94 are each D-type flip-flops, and toggle flip-flops 93 and 96 are each JK-type flip-flops.

The inverted inputs of NOR gate 97 are connected to the $\overline{\text{ALLCLEAR}}$ signal on line 99 which is decoded from driver/receiver control bus 34 by channel decode circuit 90, and connected to the $\overline{\text{VECTORCLOCK}}$ signal on line 43. The output of NOR gate 97 is connected to the clock input of prime flip-flop 92. The data input of prime flip-flop 92 is tied to a logic one. The signal DPRIME on line 99 is one of the six DPRIME lines of bus 91 and is decoded from driver/receiver control bus 34 and storage portion 82 by data decode circuit 88, and is connected to the clear input of prime flip-flop 92. The $\overline{\text{Q}}$ output of prime flip-flop 92 is connected to both J and K inputs of toggle flip-flop 93. The complemented clock input of toggle flip-flop 93 is connected to line 43 to receive the $\overline{\text{VECTORCLOCK}}$ signal. The complemented clear input of toggle flip-flop 93 is connected to the $\overline{\text{ALLCLEAR}}$ signal on line 99. The expected response data is provided by the Q output of toggle flip-flop 93.

Similarly, the inverted inputs of NOR gate 98 are connected to the $\overline{\text{ALLCLEAR}}$ signal on line 99 and to the $\overline{\text{VECTORCLOCK}}$ signal on line 43. The output of NOR gate 98 is applied to the clock input of prime flip-flop 94. The data input of prime flip-flop 94 is connected to a logic one. The signal EPRIME on line 101 is one of the six EPRIME lines of bus 91 decoded from driver/receiver control bus 34 and storage portion 82 by enable decode circuit 89, and drives the clear input of prime flip-flop 94. The $\overline{\text{Q}}$ output of prime flip-flop 94 is connected to both J and K of toggle flip-flop 96. The complemented clock input of toggle flip-flop 96 is connected to line 43 to receive the $\overline{\text{VECTORCLOCK}}$ signal. The complemented clear input of toggle flip-flop 96 is connected to the $\overline{\text{ALLCLEAR}}$ signal 99. The expected response enable is provided by the Q output of toggle flip-flop 96.

The expected data and enable responses are applied to response compare section 41 along with measured response data from response bus 44. One bit of response bus 44 is associated with each of the channels of response analysis circuit 38. This single bit contains actual response data from a single tester pin, and is referred to herein as a digital response pole. A comparison between the expected response data produced by toggle flip-flop 93 and the actual response data appearing on the appropriate digital response pole of response bus 44 is performed by EXCLUSIVE-OR gate 102. The output of EXCLUSIVE-OR gate 102 is applied, with the expected enable data produced by toggle flip-flop 96, to AND gate 103. Thus, the output of AND gate 103 is a digital comparison between actual response data and expected response data, as long as the expected enable bit is true. A comparison that fails produces a logic one output from AND gate 103. When the enable bit is false, the data comparison is ignored, and the result is the same as a comparison that passes (the output of AND gate is a logic zero). In this way, the enable bit is used to qualify or ignore the actual response.

Under control of the SELECTCOMPARE signal appearing on line 46, multiplexer 104 will choose either comparison data produced by AND gate 103 or actual response data from response bus 44 for application to register section 42. Register section 42 includes data register 106, AND gate 105, pass/fail latch 107, and one input to global fail OR gate 108, and is modified under control of the MEASURECLOCK signal appearing on line 47. Data register 106 is a D-type register the output of which is connected to bus 22, and pass/fail latch 107 is an R/S latch. The output of pass/fail latch 107 is applied to one input of six-input global fail OR gate 108, along with the outputs from the five other pass/fail latches of the other response circuits on bus 109, to produce a global fail indication.

As can be seen from the above description of the physical attributes of the preferred embodiment of the present invention, there is no memory in the driver/receiver channels, and all memory is centrally concentrated in the test vector processing circuit. As a result, vectors of great length can be created since vector lengths are not constrained by the length of channel memory.

Figure 5A:
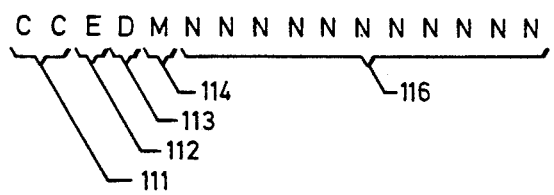
FIG. 5A the data structure of an entry in the change list memory.
Figure 5B:
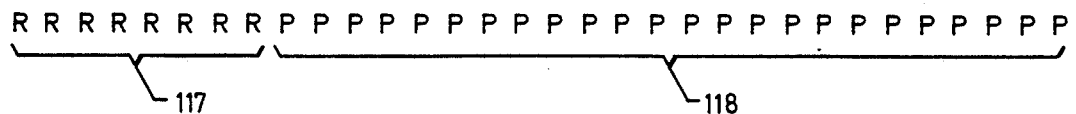
FIG. 5B is the data structure of an entry in the pointer memory.

Each entry in change list memory 32 includes the address of a tester pin which is to be toggled and applied for stimulus, or a pin whose expected response is to toggle. FIG. 5A presents the data structure of entries in change list memory 32. The highest order bits, vector sequencer control bits CC within field 111, define the following functions for vector sequencer 13: 00-continue; 01-end of list (EOL); 11-clock and continue; 10-end of test (EOT). Enable and Data toggle flags, E & D in fields 112 and 113, respectively, control whether the enable or data portion of the relevant driver/receiver channel is to toggle. The state of Measure flag M in field 114 determines whether the toggle information affects the stimulus or the expected response of the relevant driver/receiver channel. If MEASURE flag M is false, the ENABLE and DATA bits govern the stimulus and the address bits are appropriately decoded by the driver/receiver channels. If the MEASURE flag M is true, the ENABLE and DATA bits govern the expected response and the address bits are appropriately decoded by map memory 36. Finally, the eleven least significant bits in field 116 contain the address of the tester pin corresponding to the particular entry in change list memory 32. Eleven address bits allow control of 2048 channels. However, it will be understood that any number of address bits can be used to control any number of channels. FIG. 5B presents the structure of entries in pointer memory 33. 8-bit field 117 allows the storing of actual response data for a vector test, and 24-bit field 118 contains a pointer to the corresponding entry in change list memory 32.

Figures 6A, 6B, 6C, 6D, 6E, 6F:
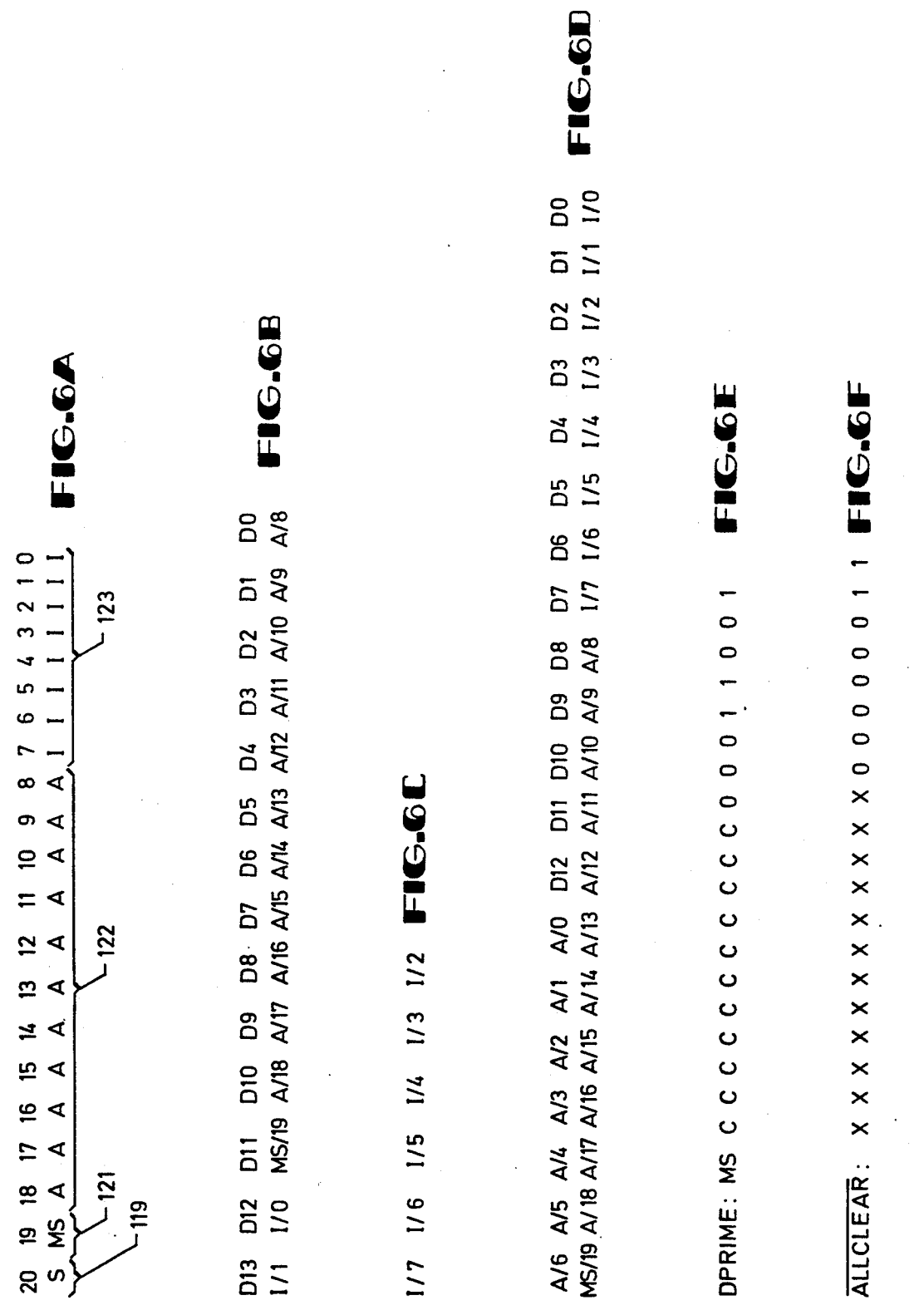

FIGS. 6A–F present the data structure for driver/receiver control bus 34. Referring to FIG. 6A, driver/receiver control bus 34 includes a control strobe bit, S in field 119, and three data fields. The first data field, 121, contains only the measure bit MS. Field 122 contains the eleven pin address bits, and field 123 contains eight instruction bits. The control strobe bit S is generated by driver/receiver control command 18, and defines when the address and instruction are valid. As previously mentioned, the mapping of internal bus 11 onto the data fields of driver/receiver control bus 34 depends on bus master 28.

As shown in FIGS. 6B and 6C, when sequencer 13 is bus master, sequencer 13 supplies bits 2–7 of instruction field 123. Address field 122, and bits 0 and 1 of instruction field 123 are supplied by change list memory 32 and are routed from data bus 22 of internal bus 11 onto driver/receiver control bus 34. In particular, bit D13 of internal bus 11 corresponds to the E-bit in change list memory 32, bit D12 of internal bus 11 corresponds to the D-bit in change list memory 32, bit D11 of internal bus 11 corresponds to the M-bit in change list memory 32, and bits D0–D10 of internal bus 11 correspond to the address bits in change list memory 32.

When vector sequencer 13 is not the bus master, internal bus 11 controls all of the data fields as illustrated in FIG. 6D. Referring to FIG. 6D, address bit A6 of address and control bus 23 of internal bus 11 supplies the MS bit, address bits A0–A5 of address and control bus 23 supply the six most significant bits of tester pin address field 122, data bits D8–D12 of data bus 22 supply the five least significant bits of field 122, and data bits D0–D7 of data bus 22 supply the instruction bits of field 123.

FIGS. 6E and 6F provide examples of instructions that may appear on driver/receiver control bus 34. FIG. 6E illustrates a DPRIME instruction, wherein the MS bit corresponds to the measure flag, and the C's indicate the driver/receiver address bits. The 1's and 0's are the actual instruction definitions. For the $\overline{\text{ALL CLEAR}}$ instruction, shown in FIG. 6F, the X's indicate bits that are irrelevant to the instruction. Regardless of the state of the MS bit or the tester pin address, all drivers are cleared by the $\overline{\text{ALLCLEAR}}$ instruction.

The operation of the invention is realized through the execution of several pieces of software, described in detail with reference to FIGS. 7–12. The highest level of control is from PC 24 which contains software to format, edit and otherwise process the digital test vector sequences that are loaded to change list memory 32 and pointer memory 33. The software within program memory 21 for microprocessor 12 accepts commands from PC 24, and controls the hardware to perform the requested actions. PC 24 can both send commands to microprocessor 12 and read from and write to all parts of RAM 16. Microprocessor 12 initially starts in a latched reset state, which is held until PC 24 has loaded the proper software into program memory 21, and has commanded bus master 28 to release microprocessor 12 and to transfer control of internal bus 11 to microprocessor 12, allowing microprocessor 12 to begin execution. Once microprocessor 12 has started, PC 24 can send commands to a FIFO memory within PC interface 14.

Figure 7:
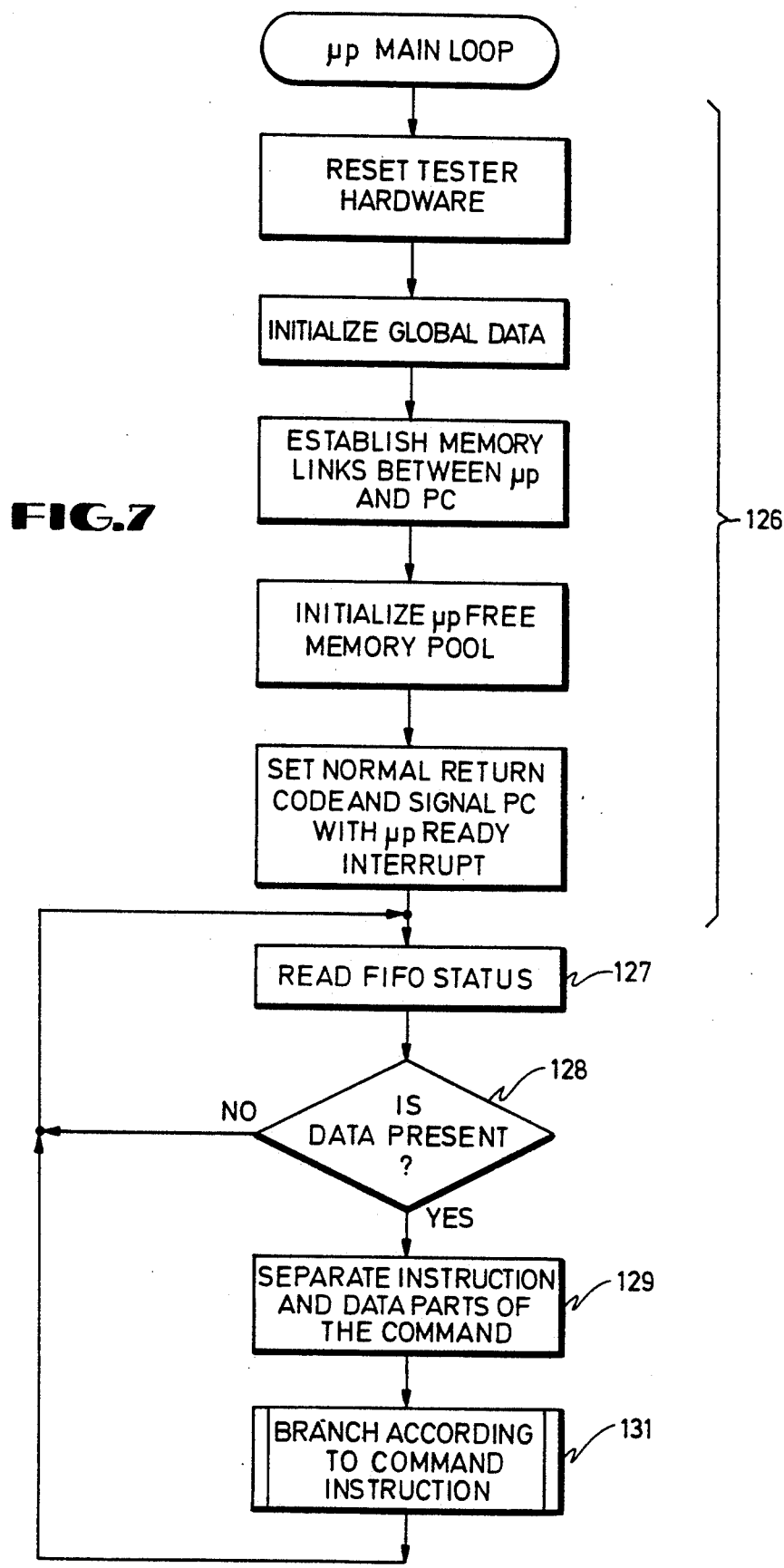
FIG. 7 is a flowchart of the main loop of the microprocessor in accordance with the present invention.

The operating program stored in program memory 21 is a command dispatcher, and is illustrated in the flowchart of FIG. 7. Once the program has completed initialization steps 126, it enters a loop including process block 127 and decision block 128 wherein the status of the FIFO memory is continuously read. If a command is determined to be present, microprocessor 12 reads the 16-bit command word in step 129 which is split into two parts: 8 bits of data and 8 bits of instruction code. The instruction code is used in step 131 to branch to the appropriate service routine to process the requested action, for example, the running of a vector test, described in detail below with reference to FIG. 12.

Most of the FIFO commands to microprocessor 12 result in a simple action of moving the data associated with the instruction code to a register within the hardware to perform an action. In other cases, an instruction code may require multiple reads and/or writes to registers within the hardware. All actions requested of microprocessor 12 that require a response back to PC 24 accomplish this by performing the requested action, saving the response in a specified memory location within program memory 21, and then interrupting PC 24 to indicate that the action has been completed. This is shown in greater detail in the flowchart of FIG. 8.

Figure 8:
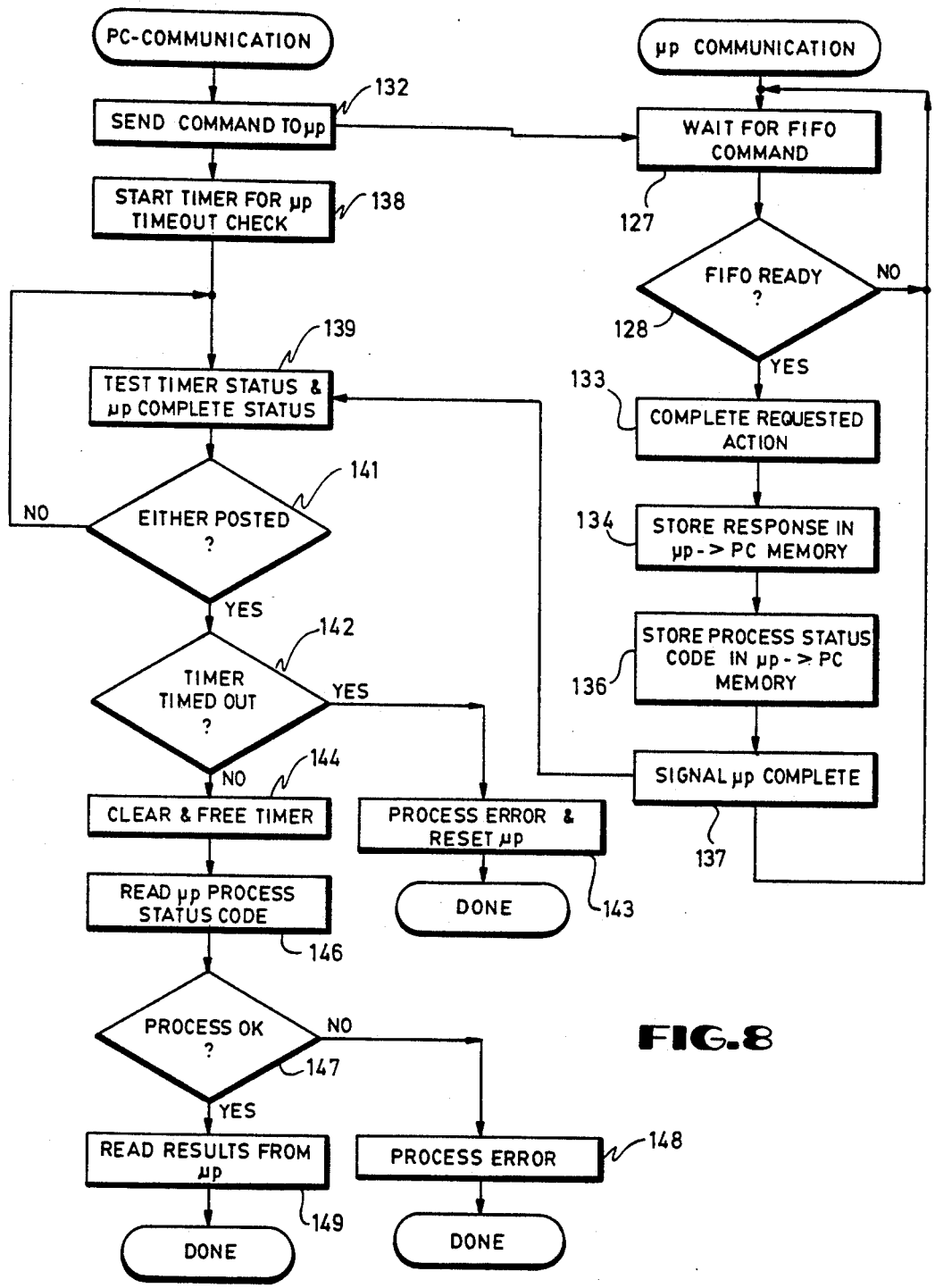
FIG. 8 is a flowchart of communications between the microprocessor and personal computer, in accordance with the present invention.

Referring to FIG. 8, in block 132, a command is sent from PC 24, and is received by FIFO memory within PC interface 14 and recognized by microprocessor 12 in block 127. As mentioned above, blocks 127 and 128 together constitute a loop wherein FIFO memory is constantly monitored for instructions from PC 24. Once an instruction is received, the action is completed in block 133, the response is recorded in program memory 21 in block 134, and the process status, for example pass/fail, is stored in program memory 21 in block 136. In block 137, microprocessor 12 signals PC 24 completion of the requested action. Once the action is completed, control passes back to block 127.

Since PC 24 and microprocessor 12 run asynchronously, and since several commands may have stacked up in the FIFO memory of PC interface 14, a time out is used by PC 24 while microprocessor 12 is performing the requested action. In particular, when PC 24 sends a command in block 132, it starts a time out timer in block 138. Blocks 139 and 141 continuously monitor the status of the timer, and the status of the complete signal generated by the microprocessor in block 137. After one or the other is detected, control passes to block 142 where it is determined whether the timer had times out. If so, indicating that microprocessor 12 has not completed the requested action within the allotted time, control passes to block 143 where the error in the operation of microprocessor 121 is processed.

If block 142 determines that the completion signal has been received from microprocessor 12, control passes to block 144 where the time out time is cleared. Then, in block 146, PC 24 reads that portion of program memory 21 set by microprocessor 12 in block 136 to determine the status of the process. If, as determined by decision block 147, the process is determined to be in error, the error is processed in block 148. If decision block 147 determines that there is no error in the process, control passes to block 149 where the response stored by microprocessor 12 in program memory 21 during the execution of block 134 is read by PC 24.

The data compression and memory conservation advantages of the present invention are best illustrated with reference to a specific application. Referring to Table I, a test for a custom device having 44 accessible nodes or test points is presented. The test sequence includes a total of 104 individual vectors, each of which is 44 pins wide. Table I lists the complete vector file used to test the device, and contains an entry for each of the 44 pins for each of the 104 vectors.

TABLE I

COMPLETE VECTOR FILE

| Vector Number | Pin Number 1  10  20  30  40 44 |
|---|---|
| 0 | ZXXXXXLXXZZXXZZZZZZXXXXXXXXXXXXXXXXXXXXXXXX |
| 1 | ZXXXXXHXXZZXXZZZZZZXXXXXXXXXXXXXXXXXXXXXXXX |
| 2 | ZXXXXXHXXZHXXLHLLLZLLHXLLLHLXXXXXXXXXXXXXXXX |
| 3 | ZXXXXXHXXZHXXLHLLHZLLHXLLLHXXXXXXXXXXXXXXXXX |
| 4 | ZXXXXXHXXZHXXLLLLHZLLHXLLLHLXXXXXXXXXXXXXXXX |
| 5 | HXXXXXHXXZHXXLLLLHZLLHXLLLHLXXXXXXXLHLHLXHL |
| 6 | HXXXXXHXXZHXXLLLLHZLLHXLLLHLXXXXXLXXLHLHLXHL |
| 7 | HXXXXXHXXZHXXLLLLHZLLHXLLLHLXXXXXHXXLHLHLXHL |
| 8 | HXXXXXHXXZHXXLLLLHLLLHXLLLHLXXXXXHXXLHLHLXHL |
| 9 | HXXXXXHXXZHXXLLLLHLDUDXUDUDUXXXXXHXXLHLHLXHL |
| 10 | HXXXXXHXXZHXXLLLLHHXXXXXXXXXXXXXXHXXLHLHLXHL |
| 11 | LXXXXXHXXZHXXLLLLHHXXXXXXXXXXXXXXHXXHLHLHXLH |
| 12 | LXXXXXHXXZHXXLLLLHHXXXXXXXXXXXXXXLXXHLHLHXLH |
| 13 | LXXXXXHXXZHXXLLLLHHXXXXXXXXXXXXXXHXXHLHLHXLH |
| 14 | LXXXXXHXXZHXXLLLLHLXXXXXXXXXXXXXXHXXHLHLHXLH |
| 15 | LXXXXXHXXZHXXLLLLHLUDUXDUDUDXXXXXHXXHLHLHXLH |
| 16 | LXXXXXHXXZHXXLLLHHLXXXXXXXXXXXXXXHXXHLHLHXLH |
| 17 | LXXXXXHXXZHXXLLLHHXXXXXXXXXXXXXXXHXXHLHLHXLH |
| 18 | LXXXXXLXXZHXXLLLHHHXXXXXXXXXXXXXXHXXHLHLHXLH |
| 19 | LXXXXXHXXZHXXLLLHHHXXXXXXXXXXXXXXHXXHLHLHXLH |
| 20 | LXXXXXHXXZHXXLHLLLHLLLXLLLLLLXXXXXHXXHLHLHXLH |
| 21 | LXXXXXHXXZHXXLHLLHHLLLXLLLLLLXXXXXHXXHLHLHXLH |
| 22 | LXXXXXHXXZHXXHLLLLHLLLLXLLLHLXXXXXHXXHLHLHXLH |
| 23 | LXXXXXHXXZHXXHLLLHHLLLLXLLLHLXXXXXHXXHLHLHXLH |
| 24 | LXXXXDHXXZHXXHLLLHHLLLXLLLHLXXXXXHXXHLHLHXLH |
| 25 | LXXXXXHXXZHXXHLLLHHLLLXLLLHLXXXXXHXXHLHLHXLH |
| 26 | LXXXXXHXXZHXXHLLLLHLLLXLLLLLXXXXXHXXHLHLHXLH |
| 27 | LXXXXXHXXZHXXHLLLHHLLLLXLLLLLLXXXXXHXXHLHLHXLH |
| 28 | LXXXXUHXXZHXXHLLLHHLLLXLLLLLLXXXXXHXXHLHLHXLH |
| 29 | LXXXXUHXXZHXXHLLLLHLLLXLLHLLXXXXXHXXHLHLHXLH |
| 30 | LXXXXUHXXZHXXHLLLHHLLLXLLHLLXXXXXHXXHLHLHXLX |
| 31 | LXXXDUHXXZHXXHLLLHHLLLLXLLXXXXXHXXHLHLHXLH |
| 32 | LXXXXUHXXZHXXHLLLLHHLLLXLLHLLXXXXXHXXHLHLHXLH |
| 33 | LXXXXUHXXZHXXHLLLLHLLLXLLLLLLXXXXXHXXHLHLHXLH |
| 34 | LXXXXUHXXZHXXHLLLHHLLLXLLLLLLXXXXXHXXHLHLHXLH |
| 35 | LXXXXUHXXZHXXHLLLHHLLLXLLLLLLXXXXXHXXHLHLHXLH |
| 36 | LXXXUUHXXZHXXHLLLLHLLLXLHLLLXXXXXHXXHLHLHXLH |
| 37 | LXXXUUHXXZHXXHLLLHHLLLXLHLLLXXXXXHXXHLHLHXLH |
| 38 | LXXDUUHXXZHXXHLLLLHHLLLXLHLLLXXXXXHXXHLHLHXLH |
| 39 | LXXXUUHXXZHXXHLLLLHHLLLXLHLLLXXXXXHXXHLHLHXLH |
| 40 | LXXXUUHXXZHXXHLLLLLHLLLXLLLLLLXXXXXHXXHLHLHXLH |

TABLE I-continued
COMPLETE VECTOR FILE

```
               Pin Number
               1        10       20       30       40  44
Vector Number  |--------|--------|--------|--------|---|
```

| Vector Number | Data |
|---|---|
| 41 | LXXXUUHXXZHXXHLLLHHLLLXLLLLLLXXXXXHXXHLHLHXLH |
| 42 | LXXUUUHXXZHXXHLLLHHLLLXLLLLLLXXXXXHXXHLHLHXLH |
| 43 | LXXUUUHXXZHXXHLLLLHLLLXHLLLLXXXXXHXXHLHLHXLH |
| 44 | LXXUUUHXXZHXXHLLLHHLLLXHLLLLLXXXXXHXXHLHLHXLH |
| 45 | LXXUUUHXXZHXXHLLLHHLLLXHLLLLLXXXXDHXXHLHLHXLH |
| 46 | LXXUUUHXXZHXXHLLLHHLLLXHLLLLLXXXXXHXXHLHLHXLH |
| 47 | LXXUUUHXXZHXXHLLLLHLLLLXLLLLLLXXXXXHXXHLHLHXLX |
| 48 | LXXUUUHXXZHXXHLLLHHLLLXLLLLLLXXXXXHXXHLHLHXLH |
| 49 | LXXUUUHXXZHXXHLLLHHLLLXLLLLLLXXXXUHXXHLHLHXLH |
| 50 | LXXUUUHXXZHXXHLLLLHHLLXLLLLLLXXXXUHXXHLHLHXLH |
| 51 | LXXUUUHXXZHXXHLLLHHHLLXLLLLLLXXXXUHXXHLHLHXLH |
| 52 | LDXUUUHXXZHXXHLLLHHHLLXLLLLLLXXXXUHXXHLHLHXLH |
| 53 | LXXUUUHXXZHXXHLLLHHHLLXLLLLLLXXXXUHXXHLHLHXLH |
| 54 | LXXUUUHXXZHXXHLLLLLHLLLXLLLLLLXXXXUHXXHLHLHXLH |
| 55 | LXXUUUHXXZHXXHLLLHHLLLXLLLLLLXXXXUHXXHLHLHXLH |
| 56 | LUXUUUHXXZHXXHLLLHHLLLXLLLLLLXXXXUHXXHLHLHXLH |
| 57 | LUXUUULXXZHXXHLLLHHLLLXLLLLLLXXXXUHXXHLHLHXLH |
| 58 | LUXUUUHXXZHXXHLLLHHLLLXLLLLLLXXXXUHXXHLHLHXLH |
| 59 | LUXUUUHXXZHXXLHLLLHLHLXLLLLLLXXXXUHXXHLHLHXLH |
| 60 | LUXUUUHXXZHXXLHLLHHLHLXLLLLLLXXXXUHXXHLHLHXLH |
| 61 | LUXUUUHXXZHXXLHLLHHLHLXLLLLLUUXUUUXXHLHLHXLH |
| 62 | LUXUUUHXXZHXXLHLLHHLHLXLLLLLLXXXXUXXXHLHLHXLH |
| 63 | LUXUUUHXXZHXXHHLLLHLLLXLHLLLXXXXUXXXHLHLHXLH |
| 64 | LUXUUUHXXZHXXHHLLHHLLLXLHLLLXXXXUXXXHLHLHXLH |
| 65 | LUXUUUHXXZHXXHHLLHHLLLXLHLLLXXXXUDXXHLHLHXLH |
| 66 | LUXUUUHXXZHXXHHLLHHLLLXLHLLLXXXXUXXXHLHLHXLH |
| 67 | LUXUUUHXXZHXXHHLLLHLLLXLHLLXXXXUXXXHLHLHXLH |
| 68 | LUXUUUHXXZHXXHHLLHHLLLXLHLLXXXXUXXXHLHLHXLH |
| 69 | LUXUUUHXXZHXXHHLLHHLLLXLHLLDXXXUUXXHLHLHXLH |
| 70 | LUXUUUHXXZHXXHHLLHHLLLXLHLLXXXXUXXXHLHLHXLH |
| 71 | LUXUUUHXXZHXXHHLLLHLLLXLLLHLXXXXUXXXHLHLHXLH |
| 72 | LUXUJUHXXZHXXHHLLHHLLLXLLLLHLXXXXUXXXHLHLHXLH |
| 73 | LUXUUUHXXZHXXHHLLHHLLLXLLLHLUDXXUUXXHLHLHXLH |
| 74 | LUXUUUHXXZHXXHHLLHHLLLXLLLHLXXXXUXXXHLHLHXLH |
| 75 | LUXUUUHXXZHXXHHLLLHLLLXLLLLHXXXXUXXXHLHLHXLH |
| 76 | LUXUUUHXXZHXXHHLLHHLLLXLLLLHXXXXUXXXHLHLHXLH |
| 77 | LUXUJUHXXZHXXHHLLHHLLLXLLLLLHUUXDUUXXHLHLHXLH |
| 78 | LUXUUUHXXZHXXHHLLHHLLLXLLLLLHXXXXUXXXHLHLHXLH |
| 79 | LUXUUUHXXZHXXHHLLLHLLLXLLLLLLXXXXUXXXHLHLHXLH |
| 80 | LUXUJUHXXZHXXHHLLHHLLLXLLLLLLXXXXUXXXHLHLHXLH |
| 81 | LUXUJUHXXZHXXHHLLHHLLLXLLLLLLUUXUUUXXHLHLHXLH |
| 82 | LUXUJULXXZHXXHHLLHHLLLXLLLLLLUUXUUUXXHLHLHXLH |
| 83 | LUXUUUHXXZHXXHHLLHHLLLXLLLLLLUUXUUUXXHLHLHXLH |
| 84 | LUXUUUHXXHHXXHHLLHHLLLXLLLLLLUUXUUUXXHLHLHXLH |
| 85 | LUXXUUHXXHHXXHHLLHHLLLXLLLLLLUUXUUUXXHLHLHXLH |
| 86 | LUXXUUHXXHHXXHLLLLHLLLXLHLLHUUXUUUXXHLHLHXLH |
| 87 | LUXXUUHXXHHXXHLLLHHLLLXLHLLHUUXUUUXXHLHLHXLH |
| 88 | LUXDUUHXXHHXXHLLLHHLLLXLHLLHUUXUUUXXHLHLHXLH |
| 89 | LUXDUUHXXHHXXHLLLLHHLLLXLHLLHUUXXUUXXHLHLHXLH |
| 90 | LUXDUUHXXHHXXLHLLLHHHLXLHLHLUUXXUXXXHLHLHXLH |
| 91 | LUXDUUHXXHHXXLHLLLHHHHLXLHLHLUXXXUXXXHLHLHXLH |
| 92 | LUXDUUHXXHHXXHHLLLHLLLXLHLLHUXXXUXXXHLHLHXLH |
| 93 | LUXDUUHXXHHXXHHLLLLHHLLLXLHLLHUXXXUXXXHLHLHXLH |
| 94 | LUXDUUHXXHHXXHHLLHHLLLXLHLLHUXXDUDXXHLHLHXLH |
| 95 | LUXDUUHXXHHXXHHLLHHLLLXLHLLHUUXDLDXXHLHLHXLX |
| 96 | LUXDUUHXUHHXXHHLLHHLLLXLHLLHUUXDLDXXHLHLHXLH |
| 97 | LUXDUUHXUHHXXHLHLLHHLHXLHLUUXDLDXXHLHLHXLH |
| 98 | LUXDUUHXUHHXXHLHLHHHLHXLHLHLUUXDLDXXHLHLHXLH |
| 99 | LUXDUUHXUHHXXHLHLHHHLHXLHLHLUUXDLDXXHLHLHXLH |
| 100 | LUXDUUHXDLLXXHLHLLHHHLHXLHLHLUUXDLDXXHLHLHXLH |
| 101 | LUXDUUHUDHHXXHLHLHHHLHXLHLHLUUXDLDXXHLHLHXLH |
| 102 | DUXDUUHUDHHXXHLHLHHHLHXLHLHLUUXDLDXXUDUDUXDU |
| 103 | DUXDUUHUDHHXXHLHLHHHLHXLHLHLUUXDLDDXUDUDUXDU |

In the test vector data shown in Table I, the following stimulus and measure commands are used:

X-don't care expected state
U-expect a logic one (high level output)
D-expect a logic zero (low level output)
Z-pin driver in high impedance state
L-pin driver at logic zero
h-pin driver at logic one By application of the present invention, the complete vector file is compressed by converting the vector file into change lists, with pointers to the change lists. Table II illustrates the complete vector file shown in Table I which has been compressed into pointers and change lists in accordance with the present invention.

TABLE II
POINTER AND CHANGE LIST FORMAT OF VECTOR PATTERNS

| | Pointers | | Change Lists | | | |
|---|---|---|---|---|---|---|
| State Number | Pointer Address | Index/ (Count) | | Pin-Type, ... [CC] | | |
| 0 | 175 — | 0(1) | 1-SE, | 1-ME, | 37-SED, | 37-MED, |
| 1 | 164 — | | 38-SE, | 38-ME, | 39-SED, | 39-MED, |
| 2 | 32 — | | 40-SE, | 40-ME, | 41-SED | 41-MED, |
| 3 | 56 S | | 43-SE, | 43-ME, | 44-SED, | 44-MED, |
| 4 | 133 S | | [EOL] | | | |
| 5 | 83 — | 16(1) | 20-SE, | 20-ME, | 21-SE, | 21-MED, |
| 6 | 174 — | | 22-SED, | 22-ME, | 24-SE, | 24-MED, |
| 7 | 172 — | | 25-SE, | 25-ME, | 26-SE, | 26-MED, |
| 8 | 173 — | | 27-SED, | 27-ME, | 28-SE, | 28-MED, |
| 9 | 16 — | | [EOL] | | | |
| 10 | 66 — | 32(1) | 11-SED, | 14-SE, | 15-SED, | 16-SE, |
| 11 | 75 — | | 17-SE, | 18-SE,. | 20-SE, | 21-SE, |
| 12 | 172 S | | 22-SED, | 24-SE, | 25-SE, | 26-SE, |
| 13 | 172 S | | 27-SED, | 28-SE, | [EOL] | |
| 14 | 74 S | 46(1) | 15-SD, | 17-SD, | 28-SE, | 20-SE, |
| 15 | 58 S | | 21-SE, | 22-SE, | 24-SE, | 25-SE, |
| 16 | 57 — | | 26-SE, | 27-SE, | | |
| 17 | 74 S | *56(21) | 18-SD, | [EOL] | | |
| 18 | 164 S | 57(1) | 17-SD, | | | |
| 19 | 164 S | *58(1) | 20-MED, | 21-ME, | 22-MED, | 24-ME, |
| 20 | 46 — | | 25-MED, | 26-ME, | 27-MED, | 28-ME, |
| 21 | 56 S | | [EOL] | | | |
| 22 | 134 — | 66(1) | 28-MED, | 20-ME, | 21-MED, | 22-ME, |
| 23 | 56 S | | 24-MED, | 25-ME, | 26-MED, | 27-ME, |
| 24 | 171 — | *74(2) | 19-SD, | [EOL] | | |
| 25 | 171 S | 75(I) | 1-SD, | 37-SD, | 38-SD, | 39-SD, |
| 26 | 136 S | | 40-SD, | 41-SD, | 43-SD, | 44-SD, |
| 27 | 56 S | | [EOL] | | | |
| 28 | 170 — | 83(1) | 1-SED, | 37-SE, | 38-SED, | 39-SE, |
| 29 | 145 S | | 40-SED, | 41-SE, | 43-SED, | 44-SE, |
| 30 | 56 S | | [EOL] | | | |
| 31 | 169 — | 91(1) | 15-SD, | 16-SD, | 22-SD, | 20-SD, |
| 32 | 169 S | *95(1) | 27-SD, | | | |
| 33 | 145 S | *96(1) | 18-SD, | 28-SD, | [EOL] | |
| 34 | 56 S | 98(1) | 15-SD, | | | |
| 35 | 168 — | *99(1) | 14-SD, | 28-SD, | 27-SD, | 21-SD, |
| 36 | 120 S | *103(2) | 20-SD, | 18-SD, | [EOL] | |
| 37 | 56 S | 105(1) | 34-SED, | | | |
| 38 | 161 — | *106(2) | 30-MED, | 29-MED, | | |
| 39 | 161 S | *108(1) | 32-MED, | 34-MED, | [EOL] | |
| 40 | 120 S | 110(1) | 8-MED, | 10-SD, | 11-SD, | 18-SD, |
| 41 | 56 S | | [EOL] | | | |
| 42 | 162 — | 114(1) | 9-MD, | 10-SD, | 11-SD, | 18-SD, |
| 43 | 156 — | | [EOL] | | | |
| 44 | 56 S | 118(1) | 15-SD, | 28-SD, | | |
| 45 | 167 — | *120(2) | 25-SD, | 18-SD, | [EOL] | |
| 46 | 167 S | 122(2) | 29-MED, | 30-MED, | 32-ME, | 34-MED, |
| 47 | 156 S | | [EOL] | | | |
| 48 | 56 S | 126(1) | 14-SD, | 18-SD, | 21-SD, | 25-SD, |
| 49 | 140 S | | [EOL] | | | |
| 50 | 103 S | 130(1) | 14-SD, | 21-SD, | 18-SD, | |
| 51 | 56 S | *133(1) | 15-SD, | [EOL] | | |
| 52 | 166 — | 134(1) | 14-SD, | 15-SD, | | |
| 53 | 166 S | *136(1) | 18-SD, | 27-SD, | [EOL] | |
| 54 | 103 S | 138(1) | 30-MED, | 33-SE, | | |
| 55 | 56 S | *140(1) | 33-MED, | [EOL] | | |
| 56 | 165 — | 141(2) | 29-MED, | 30-ME, | 34-MED, | [EOL] |
| 57 | 164 S | 144(1) | 27-SD, | | | |
| 58 | 164 S | *145(2) | 26-SD, | 18-SD, | [EOL] | |
| 59 | 130 — | 147(1) | 18-SD, | 25-SD, | 26-SD, | [EOL] |
| 60 | 56 S | 150(1) | 32-ME, | | | |
| 61 | 105 — | *151(2) | 34-ME, | [EOL] | | |
| 62 | 106 S | 152(1) | 18-SD, | 30-MED, | [EOL] | |
| 63 | 126 — | 154(2) | 29-ME, | 34-MED, | [EOL] | |
| 64 | 56 S | 156(2) | 18-SD, | 24-SD, | [EOL] | |
| 65 | 151 S | 158(1) | 35-ME, | [EOL] | | |
| 66 | 151 S | 159(1) | 0-S | [EOL] | | |
| 67 | 147 — | 160(1) | 9-MED, | [EOL] | | |
| 68 | 56 S | 161(3) | 4-ME, | [EOL] | | |
| 69 | 154 — | 162(2) | 4-MED, | [EOL] | | |
| 70 | 154 S | 163(1) | 10-SED, | [EOL] | | |
| 71 | 144 — | 164(7) | 7-SD, | [EOL] | | |
| 72 | 56 S | 165(1) | 2-MED, | [EOL] | | |
| 73 | 141 — | 166(2) | 2-ME, | [EOL] | | |
| 74 | 141 S | 167(2) | 33-ME, | [EOL] | | |
| 75 | 95 S | 168(1) | 5-MED, | [EOL] | | |
| 76 | 56 S | 169(2) | 5-ME, | [EOL] | | |

TABLE II-continued
POINTER AND CHANGE LIST FORMAT OF VECTOR PATTERNS

| Pointers | | Change Lists | | |
|---|---|---|---|---|
| State Number | Pointer Address | Index/ (Count) | Pin-Type, | . . . [CC] |
| 77 | 122 — | 170(1) | 6-MED, | [EOL] |
| 78 | 122 S | 171(2) | 6-ME, | [EOL] |
| 79 | 96 S | 172(3) | 34-SD, | [EOL] |
| 80 | 56 S | 173(1) | 19-SE, | [EOL] |
| 81 | 106 S | 174(1) | 34-SE, | [EOL] |
| 82 | 164 S | 175(1) | 7-SE, | [EOL] |
| 83 | 164 S | 176(1) | [EOT] | |
| 84 | 163 — | | | |
| 85 | 162 S | | | |
| 86 | 118 — | | | |
| 87 | 56 S | | | |
| 88 | 161 S | | | |
| 89 | 108 S | | | |
| 90 | 98 — | | | |
| 91 | 152 — | | | |
| 92 | 99 S | | | |
| 93 | 56 S | | | |
| 94 | 150 — | | | |
| 95 | 138 — | | | |
| 96 | 160 — | | | |
| 97 | 91 — | | | |
| 98 | 56 S | | | |
| 99 | 159 — | | | |
| 100 | 114 — | | | |
| 101 | 110 — | | | |
| 102 | 0 — | | | |
| 103 | 158 — | | | |
| 104 | 176 — | | | |

Table II contains an ASCII representation of the pointer and change list data for the same vector file shown in Table I. The data has been compressed and optimized (see FIGS. 9 and 10 and accompanying text) to yield the smallest possible change list memory usage. The first column in Table II "State Number", is included to facilitate cross-reference between the entries of Tables I and II, but is not actually stored. The second column "Pointer Address," is the ASCII address within the change list referred to by the particular pointer. The third column "Index/(Count)," is included in this example to show the entry points into the change list memory, and to show the number of references to this portion of the change list memory. Once again, similar to the information included in column 1 of Table II, the information in column 3 of Table II is used for illustrative purposes, and is not actually stored. In the entries of column 3, the first number is the list address offset or index value. These numbers are used to match the "Pointer Address" references made in the pointer entries to the change list memory. The second number, contained in parentheses, is the count of references made to this portion of the change list. The remaining columns "Pin-Type . . . [CC]" are used to represent the pin toggles and sequencer control code (CC) required to produce the complete vector file. It should be noted that a change list entry includes all Pin-Type entries from the specified change address to the next end of list [EOL]marker. In the Pointer Address field, a "-" indicates the first reference to any complete list entry, and a "S" indicates a reference to a partial list entry or a multiple reference to a complete list. In the Index- /(Count) field, a "*" indicates a partial list entry point. State Number 104 (the last State Number), has Pointer Address 176 which, in the Index/(Count) and pin-type columns, indicates a no-op with an end of test [EOT]- control code.

The data appearing in Table I can be compared with that of Table II to show the correlation between the two tables. For example, the differences between the vector patterns 91 and 92 in Table I indicate that pins 14, 18, 20, 21, 27 and 28 are changing stimulus data state, with no enable state changes. By looking up pattern 92 in Table II, under the State Number column, the corresponding Pointer Address is found to be 99. This entry is indicated to be a shared list within the Pointer Address field. Using the Pointer Address of 99 in the Index/(Count) column, the change list, in the Pin-Type column, is found to contain stimulus data state changes for pins 14, 28, 27, 21, 20 and 18, which is the same set of changes found in the actual data. The order of these pin changes has been optimized to allow the sharing of the list beginning at address 99, with the list beginning at address 103 which contains stimulus data state changes on only pins 20 and 18. It is further noted that the change list starting at address 99 is also a shared entry into the change list starting at pointer address 98 which contains stimulus data state changes on pins 15, 14, 28, 27, 21, 20 and 28.

The storage requirements for the data shown in Table I can be compared with that of the data shown in Table II by assuming that for each pin state, at least three bits of memory would be required to represent all possible combinations of the pin state requirements. Then, assuming only 44 tester channels with vector capability, at least 1716 bytes of storage would be required to store the data of Table I. If on the other hand, 2048 tester channels are assumed, each with "RAM behind the pin," as much as 79872 bytes of storage would be required. Depending on the method of storage within the tester, the actual memory requirements could even be greater.

The total memory requirements for the same vector data, illustrated in Table II, would only be 768 bytes, which represents a compression rate of better than 1:2.234 in one case, and 1:104 in the other case. The rate of compression is influenced by many factors. The present invention typically achieves higher rates of data compression for test vectors that are considerably longer than their width, that is to say, that have many more vectors than pins. In the illustrative example, the vector to pin ratio is only 1:2.37. It has been observed with test vector files with a greater number of vectors, or fewer pins, the rate of compression is greater.

Figure 9:
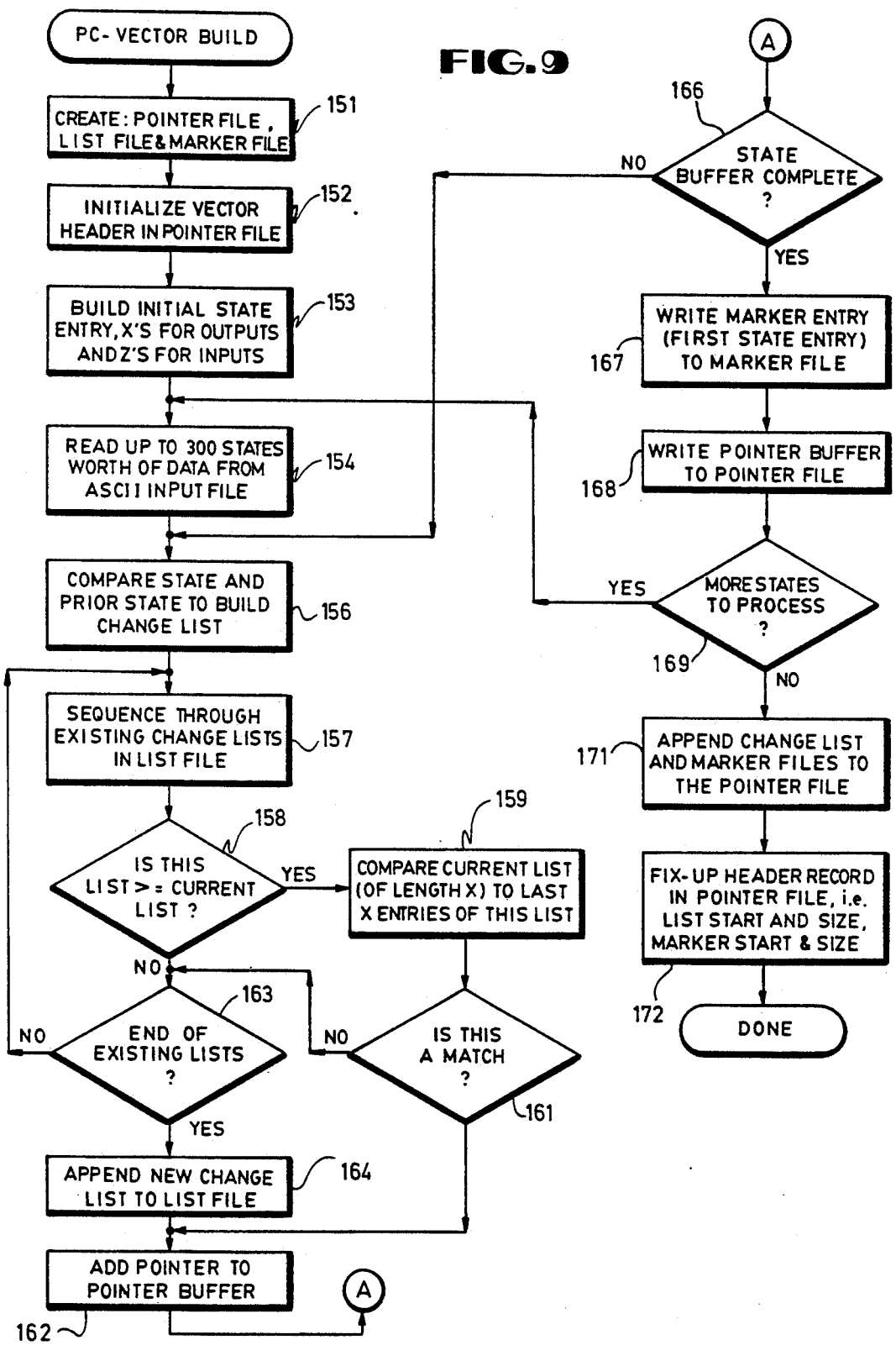
FIG. 9 is a flowchart of test vector compression, in accordance with the present invention.
Figure 10:
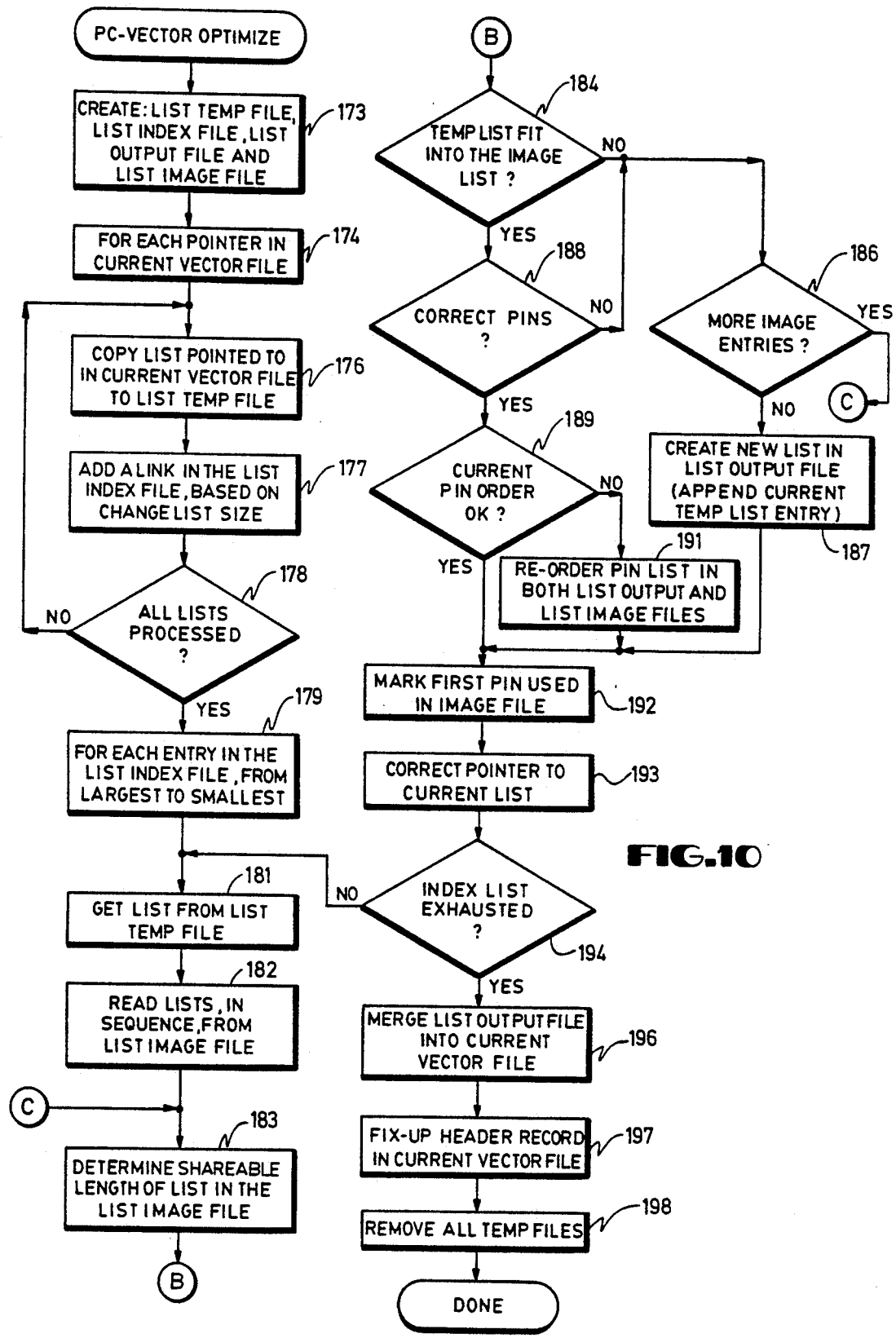
FIG. 10 is a flowchart of test vector optimization, in accordance with the present invention.

Data compression is performed by PC 24 in accordance with the procedures shown in flowchart form in FIGS. 9 and 10. The conversion of the actual vector data into the pointer and change list format is performed in two separate steps. The first step, compression, is a vector by vector process that produces a usable pointer and change list image. This image contains any list sharing that can be achieved without re-sizing or reordering of the list elements or without modifying pointer addresses. The second step, optimization, is a more complex process that attempts to combine list entries into the most efficient grouping to reduce memory usage. The optimization phase reduces the size of a vector image thus reducing disk storage requirements and also reducing the time to load the image from PC 24 to RAM 16 before execution of the vector patterns.

Referring to FIG. 9, compression into the pointer and change list format is achieved by sequencing through the vectors in the vector file (for example Table I), one at a time, and by comparing the current vector with the prior vector. After a pointer file, list file and marker file are created in block 151, the header information in the pointer file is initialized in block 152. This header information includes, for example, the number of pins involved in the test, the number of vectors (equal to the number of pointers), a file pointer to the start of pointer data, a file pointer to the start of change list data, and a file pointer to the start of marker data. This information is later used to dynamically apportion the pointer and change list memories with RAM 16 when PC 24 loads a vector test sequence to RAM 16, as explained in more detail with reference to FIG. 11. The marker file is used primarily to facilitate editing.

In block 153, an initial state is built of all Z's and all X's for stimulus and response pins, for comparison with the first vector in the vector file. Then, in block 154, a number of vectors, for example, 300, are read into a state buffer. In block 156, the first vector in the state buffer is compared with the prior state in order to build a change list. The first vector is compared with the initial state set in block 153. Control then passes to block 157 where sequencing through existing change lists is begun. As determined by decision block 158, if the current change list is less than or equal in length to the selected existing change list, control passes to block 158 where the current change list (of length x) is compared to the last x entries of the selected existing change list. If there is a match, as determined by decision block 161, the sequencing through the existing change list is stopped, and a pointer is added to the pointer buffer in block 162. If, on the other hand, no match is found by decision block 161, control passes to decision block 163 where it is determined whether the end of the existing change lists has been reached. If not, control passes to block 157 where the sequencing through existing change lists continues. If so, control passes to block 164 where the current change list is appended to the existing change list file, and, in block 162, a pointer is added to the pointer buffer. Control then passes to decision block 166 where it is determined whether the end of the state buffer, loaded in block 154, has been reached. If not, control passes back to block 156 where comparison with states in the state buffer is continued. If so, control passes to block 167 where an entry is made in the marker file, and the pointer buffer is written to the pointer file in block 168. Then, in decision block 169, it is determined whether additional states remain to be processed, and if so, control passes back to block 154 where more states are read into the state buffer. If not, control passes to block 171 where the change list and marker files are appended to the pointer file, and then, in block 172, the header is adjusted including the correction of the file pointers to the beginning of pointer data and change list data.

Further compression is achieved in an optimization phase, by attempting to re-order the entries within the individual change lists, potentially increasing the amount of change list sharing. In addition to changing the ordering of the pins, optimization detects the duplication of lists and partial lists that can occur during the compression process when short change lists are found in earlier stages of the list formatting that are containable in longer change lists found in later stages of the compression process. On larger pointer and change list files, additional compression is achieved by ordering the change list entries based on the frequency of reference, with the more frequently referenced change lists occurring at lower order addresses.

Optimization proceeds by first expanding each change list, including those that have been shared, into individual change lists which are stored in a change list temporary file. These change lists are then indexed in a change list index file based on the number of changes in the change list. This change list index file contains a list of pointers to change lists in the change list temporary file, ordered by the number of changes in each change list. Two new files are created to assist in the optimization process. These files are the change list output file, and the change list image file. The change list output file is created to contain the optimized change lists. The change list image file indicates entries within the change list output file that have been ordered for sharing. By tracking the sharing in this manner, the ordering performed in an early step is protected against later reordering that can damage an existing change list sharing relationship. Change list sharing is monitored by marking the first entry of the shared change list within the existing list. In later attempts to share a marked list, it is only possible to consider entries from the share marker closest to the EOL of a change list to the EOL marker. Starting with the longest change lists, and moving toward the shortest change lists, each list is compared to entries in the change list image file. In searching for a match, attempts are made to reorder existing change lists to share a smaller change list into an existing larger change list. If a new entry cannot be matched to any of the existing lists, a new entry in the change list output file is formed. Each time a new change list is required, an entry is created in the change list image file and in the change list output file. As each change list is processed, the pointer to the change list, either shared or newly created, is updated in the pointer file. Once all change lists have been processed, the temporary files created during the optimization process are deleted.

The optimization process is illustrated by the flowchart of FIG. 10, and proceeds by first establishing temporary files in block 173 which are used in the optimization process. These temporary files include: a change list temporary file; a change list index file; a change list output file; and a change list image file. Then, for each pointer in the pointer file (determined by block 174), the change list pointed to is copied into the change list temporary file in block 176, and, in block 177, a link in the change list index file is added, based on the change list size. Then, in decision block 178 it is determined whether all change lists have been processed. If not, control passes to block 176 where change list processing is continued. If so, control passes to block 179 where processing of the entries in the change list index file begins, from the largest to smallest change list. As a result of the processing of blocks 176, 177 and 178, the change lists, including those that have been shared, are expanded into individual change lists.

In block 181, a change list is selected from the change list temporary file according to the change list index, and, in block 182, change lists residing in the change list image file are read in sequence. In block 183, processing is begun to determine whether the change list in the change list temporary file is sharable with the change list selected from the change list image file. In particular, in decision block 184, it is determined whether the change list from the change list temporary file will fit within the change list selected from the change list image file. If not, control passes to decision block 186 where it is determined whether more entries exist in the change list image file. If so, control passes back to block 183 where the next change list in the change list image file is selected for processing. If block 186 determines that no more entries are in the change list image file, control passes to block 187 where the present change list temporary file entry is placed in the change list output file. Control then passes to block 192. If decision block 184 determines that the change list in the change list temporary file will fit within the change list selected from the change list image file, control passes to block 188 where it is determined whether the correct pin numbers are present. If not, control passes to block 186, and processing continues as described above. If so, control passes to block 189 where it is determined whether the pin numbers are in the correct order. If not, control passes to block 191 where the pin numbers in the change list output file and in the change list image file are reordered. After reordering, or if the pin numbers are already in the proper order, control passes to block 192.

In block 192, the first pin number in the change list image file is marked, and a pointer to that pin is created in block 193. Control then passes to block 194 where it is determined whether each index in the change list index file has been processed. If not, control passes back to block 181, and processing continues as described above. If, as determined by decision block 194, all change lists in the change list index file have been processed, control passes to block 196 where the change list output file is merged with the pointer file to create a compressed and optimized vector file. Then, in block 197, the header is corrected, and the temporary files are deleted in block 198.

A final step of the optimization process can be the reordering of change list elements. On vectors that require more than 32K of change list memory, the more frequently used change list entries are moved toward the beginning of the change list file. This allows the majority of pointers to these change lists to be created without use of a pointer extension word, thus minimizing the overall size of the pointer and change list file.

More particularly, when change list memory for a given test vector sequence has 32767 or fewer entries, the pointers for that vector test sequence can be represented in a short (16-bit) integer, rather than a long (32-bit) integer. When change list memory for a given vector test sequence has more than 32767 entries, optimization of pointer storage space results when change lists are ordered in terms of the number of times that they are referenced throughout the test sequence. The more frequently referenced lists are stored at the lower ordered addresses of change list memory. This arrangement allows the pointers for the most frequently used list to also be represented in a short (16-bit) integer. The most significant bit of the pointer entry is reserved as an extension bit. When the extension bit is false, the nine high order bits of the pointer address are assumed to be zero. When the extension bit is true, the nine high order bits of the pointer address are stored in a second short integer. Thus, only the less frequently used pointers consume the full 32 bits on the disk. The most frequently used pointers require only 16-bits of disk storage, and all pointers in vector test sequences with fewer than 32768 entries require only 16-bits of disk storage. The compressed pointers are expanded before they are loaded into pointer memory 33.

The effects of a previous optimization are eliminated whenever a new compression occurs. This is a result of the difference in the ordering of the operations between the two processes. The compression deals with the vectors, one at a time, in sequence from the first to the last vector, while optimization processes the changes in the vectors, from the longest change list to the shortest change list, regardless of the original order of the individual vectors. To assure that the vector file is fully compressed, it is necessary to invoke the optimization process after completing any editing or debugging of the compressed vector file.

Figure 11:
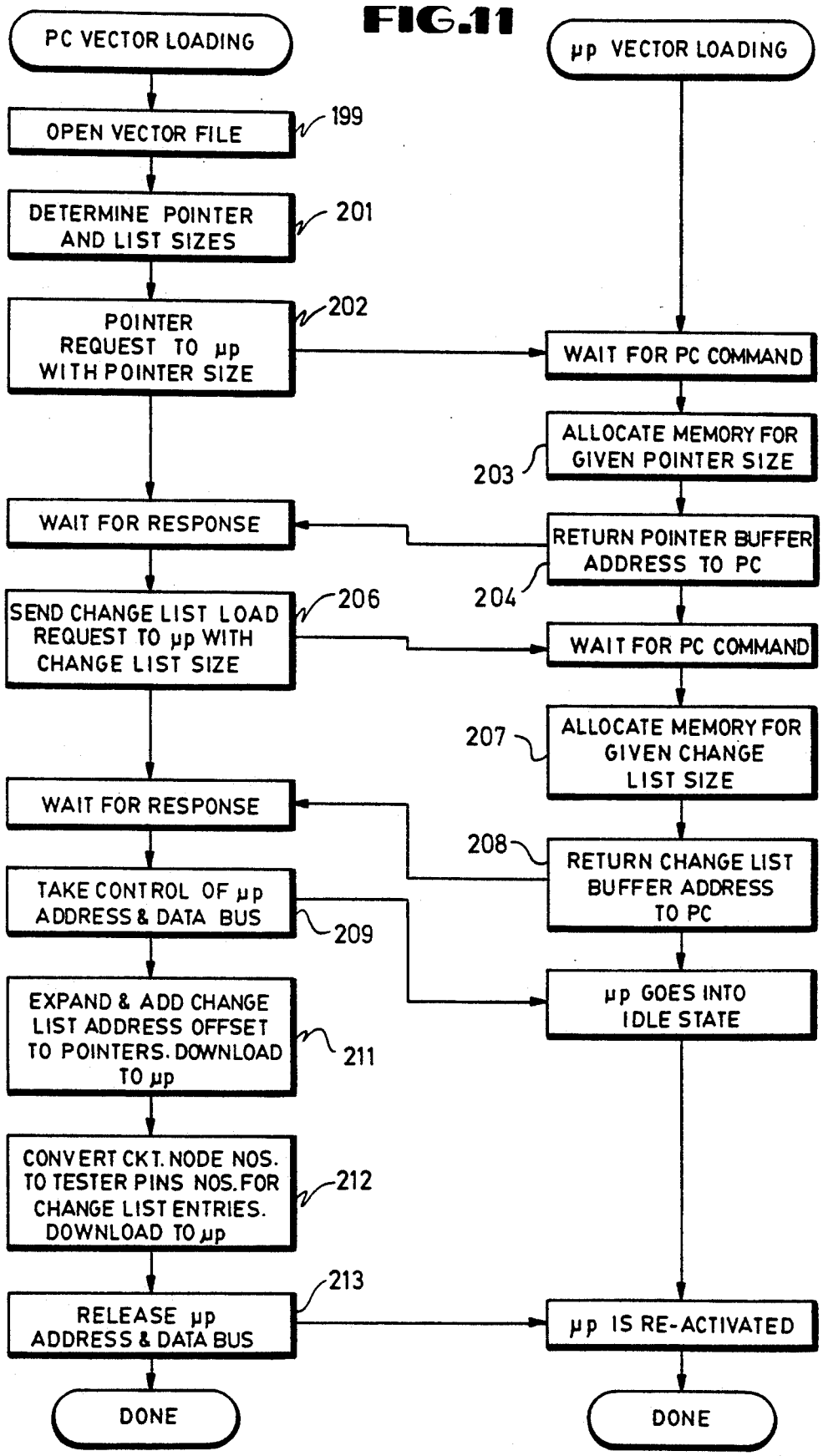
FIG. 11 is a flowchart of the loading of test vectors, in accordance with the present invention.

In accordance with the preferred embodiment of the present invention, data for a given vector test sequence is stored by PC 24 on disk in pointer and list format. This is done to provide the greatest possible throughput for the execution of the vector test patterns. Loading of the data saved for a vector test sequence from PC 24 to RAM 16 is shown in the flowchart of FIG. 11. Referring to FIG. 11, after a vector file has been opened, and the pointer and list sizes have been determined in blocks 199 and 201, PC 24 sends a command to microprocessor 12 via FIFO memory in block 202, including the number of pointers. In block 203, microprocessor 12 allocates memory in RAM 16, and responds in block 204 with a starting address to the location where the pointer data is to be loaded into pointer memory 33. PC 24 then sends a command to microprocessor 12 via FIFO memory in block 206, passing the number of entries in the change list. Microprocessor 12 allocates in block 207 memory within RAM 16 for the change list, and returns to PC 24 in block 208 a starting address to the location where the change list data is to be loaded into change list memory 32. In block 209, PC 24 takes control of internal bus 11, and begins loading of pointer and change list data into pointer memory 33 and change list memory 32 in blocks 211 and 212. Internal bus 11 is then released by PC 24 in block 213.

Figure 12:
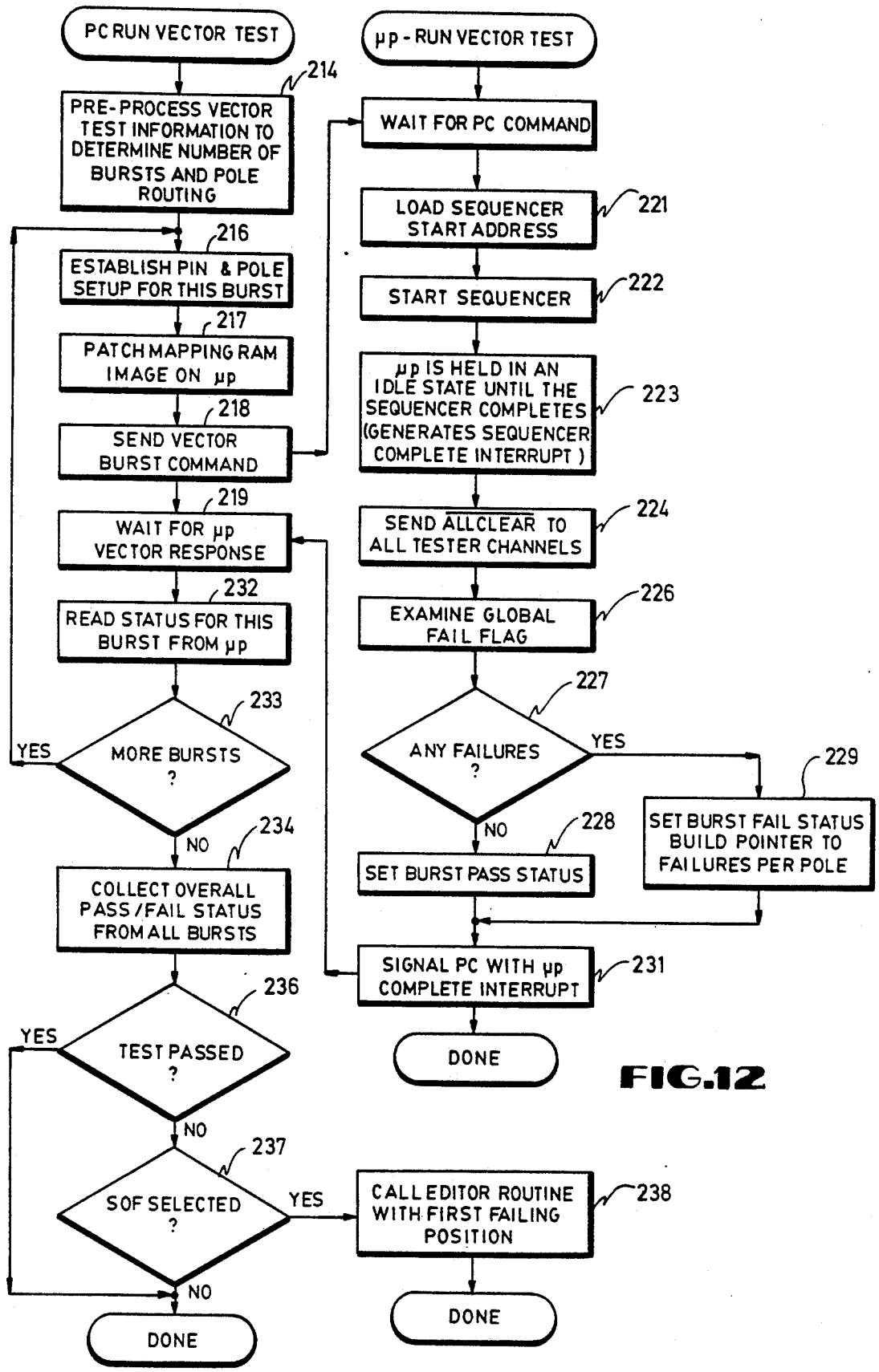
FIG. 12 is a flowchart of the running of a vector test, in accordance with the present invention.

Once the vector data is loaded, microprocessor 12 can be requested by PC 24 to execute the vector test, which is illustrated by the flowchart of FIG. 12. Referring to FIG. 12, prior to executing the vector test, PC 24 sets up the tester hardware to provide the proper response routing and capture which includes selecting the proper pole setup, to maximize the number of responses (up to six) that can be taken simultaneously. Once this is accomplished in blocks 214 and 216, PC 24 programs map memory 36 in block 217 in order to match the pole assignments. Then, in block 218, PC 24 sends a command to microprocessor 12 to start the vector sequence, and awaits a response in block 219. When commanded to initiate a vector test, microprocessor 12 loads vector sequencer 13 with the starting address of pointer memory 33 in block 221, and starts sequencer 13 in block 222. The function of sequencer 13 during a vector test in block 223 is described in more detail below.

PC 24 receives two interrupts per test burst from the vector processor, one from vector sequencer 13, and one from microprocessor 12. The first interrupt signals that vector sequencer 13 has completed the execution of the vector test (completed block 223), and the second interrupt signals that microprocessor 12 has acknowledged the complete signal from vector sequencer 13, has cleared all driver circuits 56 (block 224) and has examined the pass/fail status contained in pass/fail latch 107 and global fail OR-GATE 108 for the test burst. Prior to sending the completion interrupt, microprocessor 12 saves the appropriate status in program memory 21 including a pointer to an error map, if any (blocks 226, 227, 228, 229).

Upon receipt of the completion interrupt (block 231), PC 24 reads and saves the status and failure data, if any, for the current test burst for later processing, in block 232. Decision block 233 repeats the process, as necessary, to assure that each response pin has been tested during a burst.

Upon completion of the necessary bursts (a burst being one pass through all pointers), PC 24 collects the pass/fail data from all bursts in block 234 to determine the overall status of the test. In the event of a failure, as determined by decision block 236, PC 12 identifies the first failing state within the overall vector sequence. PC 24 either prints a failure tag describing the failure, or in the Stop On Fail mode (decision block 237), calls the vector editor in block 238, positioning the edit screen at the occurrence of the failing vector.

The operation of vector sequencer 13 during a vector test (block 223, FIG. 12) is presented below in more detail with reference again to FIGS. 1 and 2. Vector sequencer 13 performs several functions during each vector clock cycle. At the start of each cycle, vector sequencer 13 fetches the contents of the next entry from pointer memory 33, and stores the responses from the previous vector in pointer memory 33. As mentioned above, the fetched entry in pointer memory 33 contains the change list memory address of the first entry in the list of pins that are active during this particular vector clock cycle. Vector sequencer 13 then increments the fetched pointer address, pushes the incremented pointer into the stack memory of vector sequencer 13, places the fetched pointer memory entry in the change list memory address register, and retrieves the contents of the indicated change list memory entry. Vector sequencer 13 stores the pin address and control bits in the instruction register of driver/receiver command control 18, and proceeds to prime the flip-flop of the indicated channel through driver/receiver control bus 34. Vector sequencer 13 also examines the sequencer control bits (CC) of the selected change list entry to determine the next action of sequencer 13. If the control bits indicate "continue," vector sequencer 13 increments the change list memory address register and performs another prime operation for the next entry in change list memory 32. This increment and prime cycle continues until the sequencer control bits in the selected change list entry indicate "end of list" or "clock and continue." The "end of list" and "clock and continue" control codes cause vector sequencer 13 to issue the $\overline{\text{VECTOR CLOCK}}$ signal on line 43 which, as described earlier, causes all primed driver/receiver channels to toggle, and clears all primes. For "clock and continue," vector sequencer 13 continues processing the same change list after the clock has been sent. In other words, vector sequencer 13 increments the change list memory address register and performs another prime operation for the next entry in change list memory 32. The "end of list" control code indicates that all primes for the list are complete. After issuing the clock for "end of list," vector sequencer 13 pops the incremented pointer memory address from its stack memory, and uses the incremented address to select the next pointer memory entry. The prime cycle then begins again.

The pointer and prime cycles continue until the sequencer control bits of the selected change list indicate "end of test." Upon sensing an "end of test" control code, vector sequencer 13 stores the responses and then stops, the control of internal bus 11 is returned to microprocessor 12, and an interrupt is sent to PC 24 via PC interface 14.

Thus, the number of vectors in a vector test is limited only by the combined length of change list memory 32 and pointer memory 33. There is a one-to-one correspondence between the test vectors in the test vector file and the entries in pointer memory 33. Each test vector in the test vector file corresponds to one entry in pointer memory 33, and each entry in pointer memory 33 corresponds to one test vector in the test vector file. Each entry in pointer memory 33 also corresponds to one set of change list entries, however, there is not a one-to-one correspondence between the entries in pointer memory 33 and the change list entries in change list memory 32. Each change list can be associated with any number of entries in pointer memory 33. If the state changes occurring between one test vector and the next occur several times throughout a test sequence, as is the case when testing, for example, gate arrays, programmable logic devices, and LSI peripheral circuits, data can be compressed by having several different pointer memory entries address the same change list within change list memory 32.

Figure 13:
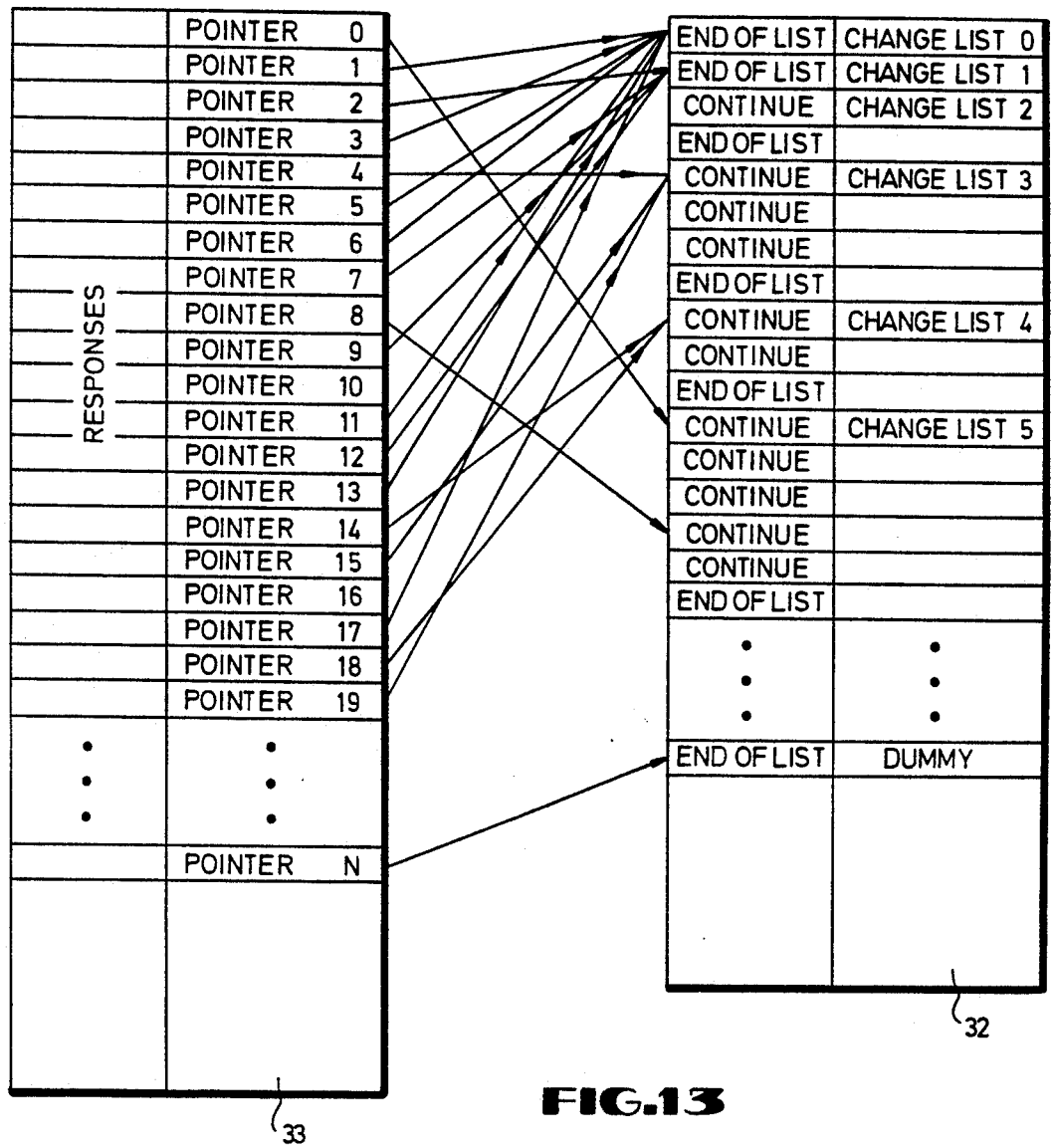
FIG. 13 is a schematic representation of interaction between the pointer and change list memories of the present invention during vector processing.

FIG. 13 is a block diagram illustrating the interaction of pointer memory 33 and change list memory 32 during the execution of a test vector sequence, in accordance with the present invention. In the simplified block diagram of FIG. 13, the illustrated operation of pointer and change list memory relates to tester channels that toggle. Stimulus and response pins are not differentiated in the figure. In practice, references to toggling pins can mean either a change in the state of the three-state driver that control a stimulus pin, or a change in the state of the expected response of a response pin.

The first pointer in pointer memory 33 (pointer 0), contains the address of the sixth change list (change list 5) stored in change list memory 32. Change list 5 includes six entries, which indicate that six tester pins will be toggled from the initial condition of the pins. The "end of list" control code in the last entry of change list 5 causes the next pointer, pointer 1, to be selected from pointer memory 33. Pointer 1 includes an address for the first change list entry (change list 0) within change list memory 32. Change list 0 includes only one entry, which indicates that only one tester channel is to be toggled. This occurs, for example, when a tester pin is connected to a clock node of a device under test. As can be seen, the first change list is called by a number of pointers (pointers 1, 3, 5, 6, 11, 13 and 17) indicating that the same tester pin is toggled to create the test vector corresponding to those pointers. Similarly, change list 1, also having only a single entry, is addressed by four different pointers, indicating that a single pin, different from the pin indicated by change list 0, is changed to create the vectors corresponding to those four pointers. Change list 2, a two-entry change list, is not addressed by any of the pointers 1-19 illustrated in FIG. 13, but would be addressed by pointers between pointer 19 and pointer N in pointer memory 33. Change list 3, a four-entry change list, is called by three pointers, and change list 4, a three-entry change list is called by two pointers.

Pointer 8 includes an address within change list memory 32 which is between the beginning and ending addresses of change list 5. Thus, the vector corresponding to pointer 8 requires toggling of only the three tester pins corresponding to the last three entries within change list 5. The test sequence continues, with vector sequencer 13 sequentially addressing pointers from pointer memory 33, and priming and toggling the tester pins included in the indicated change list or partial change list. Finally, pointer N is selected which points to an entry within change list memory 32 including an "end of test" control code which instructs vector sequencer 13 to terminate the test sequence.

Although the present invention has been described with reference to a single preferred embodiment, it will be understood by those skilled in the art that additions, deletions and modifications can be made to this preferred embodiment, without departing from the spirit and scope of the present invention.

What is claimed is:

1. A method of creating a sequence of circuit test vectors used for testing a circuit comprising:
   storing in a memory a plurality of change lists, each entry of each change list including change data for a single entry in a test vector, at least one of said change lists having a plurality of entries; and
   creating a sequence of circuit test vectors for electrical nodes of a circuit under test by sequentially selecting individual ones of said change lists in a predetermined order, and by sequentially retrieving entries of each selected change list.

2. The method of claim 1, said creating step including retrieving each entry of a selected change list.

3. The method of claim 1, said creating step comprising selecting at least a portion of at least one of said change lists more than once.

4. The method of claim 1, said storing step comprising determining a frequency of use of each of said change lists to create said sequence of test vectors, and ordering said change lists within said memory according to said frequency.

5. The method of claim 4, said storing step comprising storing more frequently used change lists at lower order addresses within said memory, than addresses of less frequently used change lists.

6. The method of claim 1, said change lists also including expected response data, the method further comprising:
   measuring selected nodes of said circuit under test to produce measured response data; and
   comparing said measured response data with said expected response data to produce comparison data.

7. The method of claim 6, further comprising storing said comparison data.

8. The method of claim 6, further comprising storing said measured response data.

9. A circuit tester comprising:
   a plurality of test pins;
   drive means, connected to the test pins, for driving selected test pins under control of a test vector;
   measurement means, connected to the test pins, for measuring data appearing on selected test pins under control of said test vector to produce measured response data;
   a change list memory for storing a plurality of change lists, each entry of each change list in said change list memory including change data for one element of said test vector, at least one of said change lists including a plurality of entries;
   a pointer memory for sequentially storing addresses of said change list memory;
   vector sequencer means, operatively connected to said drive means, measurement means, change list memory and pointer memory, for incrementally addressing said change list memory, for sequentially priming said drive means and measurement means according to entries of a selected change list, and for activating said drive means and measurement means to drive and measure said test pins at the end of each change list.

10. The circuit tester of claim 9, further comprising:
    a map memory, operatively connected to said change list memory, for converting said change data of selected change list entries into control data for controlling said measurement means.

11. The circuit tester of claim 10, said map memory further comprising:
    means for generating expected response data from said change data.

12. The circuit tester of claim 11, said measurement means further comprising means for comparing said expected response data with said measured response data to produce a comparison result.

13. The circuit tester of claim 12, further comprising:
    means, connected to said means for comparing, for storing said comparison result.

14. The circuit tester of claim 12, further comprising:
    means, connected to said measurement means, for storing said measured response data.

15. The circuit tester of claim 9, wherein said vector sequencer means activates said drive means before said measurement means.

16. The circuit tester of claim 9, wherein said vector sequencer means activates said drive means to drive said test pins simultaneously.

* * * * *